(12) United States Patent
Miyachi et al.

(10) Patent No.: US 6,759,749 B2
(45) Date of Patent: Jul. 6, 2004

(54) CIRCUIT STRUCTURE, MANUFACTURING METHOD THEREOF AND WIRING STRUCTURE

(75) Inventors: Koichi Miyachi, Kyoto (JP); Yoshihiro Izumi, Nara (JP); Hiroshi Gohda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 69 days.

(21) Appl. No.: 10/117,614

(22) Filed: Apr. 5, 2002

(65) Prior Publication Data

US 2002/0145171 A1 Oct. 10, 2002

(30) Foreign Application Priority Data

Apr. 5, 2001 (JP) ........................................ 2001-106828

(51) Int. Cl.[7] .............................................. H01L 23/48
(52) U.S. Cl. ...................... 257/758; 257/749; 257/750; 257/752; 257/440
(58) Field of Search ................................ 257/758, 749, 257/750, 752, 440

(56) References Cited

U.S. PATENT DOCUMENTS

| | | | |
|---|---|---|---|
| 5,247,191 A | | 9/1993 | Yamazaki et al. ............ 257/72 |
| 6,479,900 B1 | * | 11/2002 | Shinogi et al. ............. 257/758 |
| 6,522,011 B1 | * | 2/2003 | Farrar ....................... 257/773 |
| 6,534,870 B1 | * | 3/2003 | Shibata et al. .............. 257/759 |
| 6,570,199 B1 | * | 5/2003 | Itoh .......................... 257/275 |
| 6,593,654 B2 | * | 7/2003 | Oyamatsu ................... 257/758 |

FOREIGN PATENT DOCUMENTS

JP        11-330670        5/1998

OTHER PUBLICATIONS

Ohtake, et al., "Liquid–Crystalline Complexes of Mesogenic Dimers Containing Oxyethylene Moieties with LiCF3SO3: Self–Organized Ion Conductive Materials", Chem. Mater. 2000, vol. 12, No. 3, pp. 782–787, published Feb. 29, 2000.
Funahashi, et al., "Anomalous High Carrier Mobility in Smectic E Phase of a 2–Phenylnaphthalene Derivative", Applied Physics Letters, vol. 73, No. 25, pp. 3733–3735, published Dec. 21, 1998.

* cited by examiner

Primary Examiner—Nathan J. Flynn
Assistant Examiner—Remmon R. Fordé
(74) Attorney, Agent, or Firm—David G. Conlin; Steven M. Jensen; Edwards & Angell, LLP

(57) ABSTRACT

The circuit structure of the present invention has a plurality of conductive path layers and at least one interlayer isolating layer formed between the plurality of conductive path layers. Each of the plurality of conductive path layers has at least one conductive path capable of transmitting light or electricity therethrough. Each of a plurality of input/output (I/O) sections is connected to any one of the plurality of conductive paths. Each of the plurality of conductive path layers has a first laminated structure that includes a plurality of first conductive layers and at least one first isolating layer formed therebetween. The interlayer isolating layer has a second laminated structure that includes a plurality of second isolating layers and at least one second conductive layer formed therebetween.

12 Claims, 18 Drawing Sheets

CIRCUIT STRUCTURE, MANUFACTURING METHOD THEREOF AND WIRING STRUCTURE

BACKGROUND OF THE INVENTION

1. Field of the Invention

The present invention relates to a circuit structure (including an electric circuit structure and an optical circuit structure), a manufacturing method thereof, and a wiring structure.

2. Description of the Background Art

A wiring substrate (or an electric circuit board) having a plurality of wirings and a waveguide substrate (or an optical circuit board) having a plurality of waveguides are used in many fields. Circuit boards such as wiring substrate and waveguide substrate has a circuit structure formed thereon, which has a plurality of conductive paths (i.e., wirings or waveguides) having a prescribed shape and capable of transmitting electricity or light therethrough. A method for manufacturing the circuit structure will now be described in connection with a wiring substrate.

An electrically conductive film (e.g., a metal film) is formed on a substrate and then patterned into a prescribed shape by a photolithography process or the like. The substrate having wirings of a prescribed pattern thereon is thus produced. Alternatively, an electrically conductive layer having a prescribed pattern (i.e., wirings) may be formed on the substrate by a printing method or a transfer method.

In order to form a multi-layer wiring structure, the step of sequentially forming a wiring of a first layer, an insulating layer, and a wiring of a second layer is repeatedly conducted. Every method requires the step of patterning the wiring of each layer into a prescribed shape. More specifically, when the photolithography process is used, the photolithography step must be conducted for every electrically conductive layer for forming the wiring of the respective layer. When the printing method or the transfer method is used, the printing step using a printing plate according to the wiring of each layer or the step of transferring an electrically conductive layer having the same pattern as that of the wiring of each layer is required.

As described above, in order to form a circuit structure having a conductive path in a plurality of layers (such as a multi-layer wiring structure) by the conventional manufacturing method, the step of patterning a conductive path into a prescribed shape is required for every layer. This complicates the manufacturing process, causing increased manufacturing costs and reduced productivity.

SUMMARY OF THE INVENTION

The present invention is made to solve the above problems, and it is an object of the present invention to provide a circuit structure manufactured by a method that is simpler than the conventional example, and a manufacturing method thereof.

According to one aspect of the present invention, a circuit structure includes: a plurality of conductive paths each capable of transmitting light or electricity therethrough; a plurality of conductive path layers each having at least one of the plurality of conductive paths; at least one interlayer isolating layer formed between the plurality of conductive path layers; and a plurality of input/output (I/O) sections each connected to any one of the plurality of conductive paths. Each of the plurality of conductive path layers has a first laminated structure that includes a plurality of first conductive layers and at least one first isolating layer formed between the plurality of first conductive layers. The at least one interlayer isolating layer has a second laminated structure that includes a plurality of second isolating layers and at least one second conductive layer formed between the plurality of second isolating layers. The above object is thus achieved.

For example, the circuit structure may function as a waveguide structure. In this case, the plurality of conductive paths are a plurality of waveguides, the plurality of conductive path layers are a plurality of waveguide layers, the plurality of first conductive layers are a plurality of first core layers, and the at least one first isolating layer is at least one first cladding layer. Moreover, the at least one interlayer isolating layer is at least one isolating layer for isolating the waveguide layers from each other, the plurality of second isolating layers are a plurality of second cladding layers, and the plurality of second conductive layers are a plurality of second waveguide layers.

Alternatively, the circuit structure may function as a wiring structure. In this case, the plurality of conductive paths are a plurality of wirings, the plurality of conductive path layers are a plurality of wiring layers, the plurality of first conductive layers are a plurality of first electrically conductive layers, and the at least one first isolating layer is at least one first insulating layer. Moreover, the at least one interlayer isolating layer is at least one interlayer insulating layer, the plurality of second isolating layers are a plurality of second insulating layers, and the plurality of second conductive layers are a plurality of second electrically conductive layers. Furthermore, the plurality of I/O sections are a plurality of input/output (I/O) electrodes.

Each of the plurality of I/O electrodes may contact the plurality of first electrically conductive layers of a corresponding first laminated structure at a surface crossing surfaces of the plurality of first electrically conductive layers.

Preferably, the plurality of first electrically conductive layers included in the first laminated structure and the at least one second electrically conductive layer included in the second laminated structure are formed from substantially the same material, and the at least one first insulating layer included in the first laminated structure and the plurality of second insulating layers included in the second laminated structure are formed from substantially the same material.

Preferably, the above circuit structure further includes a substrate having a plurality of grooves, and the plurality of wiring layers and the at least one interlayer insulating layer are formed in the plurality of grooves.

The first laminated structure and the second laminated structure may be formed from a bilayer membrane of amphiphilic molecules.

Preferably, the first laminated structure and the second laminated structure are formed from a material exhibiting a smectic phase. More preferably, the smectic phase is a smectic E phase.

The first laminated structure and the second laminated structure may include a hardened smectic liquid crystal material.

Preferably, the above circuit structure further includes a substrate having at least one groove, and the first laminated structure is formed in the at least one groove.

According to another aspect of the present invention, a wiring structure includes: a plurality of wiring layers; a plurality of interlayer insulating layers laminated alternately with the plurality of wiring layers; and a plurality of input/output (I/O) electrodes each connected to any one of the plurality of wiring layers. Each of the plurality of wiring layers is not substantially patterned. The above object is thus achieved.

According to still another aspect of the present invention, a method for manufacturing a circuit structure includes the steps of: forming an alternate laminated structure of a plurality of first layers and a plurality of second layers separating the plurality of first layers from each other, the plurality of first layers having a first property, and the plurality of second layers having a second property; and forming a conductive path including at least a part of a first laminated structure, the fist laminated structure forming a part of the alternate laminated structure. The above object is thus achieved.

The above method may further includes the steps of forming another conductive path, the another conductive path being formed from another first laminated structure that forms another part of the alternate laminated structure; and forming an interlayer isolating layer, the interlayer isolating layer being formed from a second laminated structure that forms a part of the alternate laminated structure located between the conductive path and the another conductive path.

Preferably, the above method further includes the step of preparing a substrate having a groove of a prescribed pattern at its surface, and the step of forming the alternate laminated structure includes the step of forming at least a part of the alternate laminated structure within the groove.

The step of preparing the substrate may include the step of forming a plurality of grooves having different depths at the surface of the substrate.

The plurality of first layers may be a plurality of waveguide layers, the plurality of second layers may be a plurality of cladding layers, and the step of forming the conductive path may be the step of forming a waveguide.

Alternatively, the plurality of first layers may be a plurality of electrically conductive layers, the plurality of second layers may be a plurality of insulating layers, and the step of forming the conductive path may be the step of forming a wiring.

Preferably, the step of forming the alternate laminated structure includes the step of forming the alternate laminated structure by using a material exhibiting a smectic phase. More preferably, the smectic phase is a smectic E phase.

The step of forming the alternate laminated structure may include the step of hardening the material exhibiting the smectic phase.

BRIEF DESCRIPTION OF THE DRAWINGS

FIGS. 14A and 14B show another wiring structure of the second embodiment, wherein FIG. 14A is a top view and FIG. 14B is cross-sectional view taken along line 14B–14B' in FIG. 14A;

DETAILED DESCRIPTION OF THE PREFERRED EMBODIMENTS

Figure 1A:
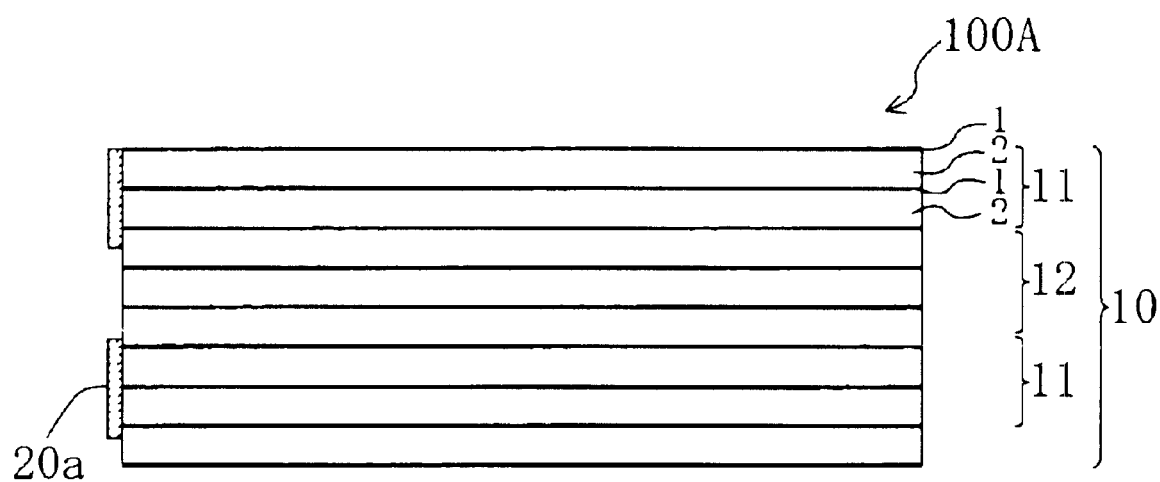
FIGS. 1A and 1B are schematic partial cross-sectional views of a wiring structure according to a first embodiment of the present invention.

First, the basic structure of a circuit structure according to the present invention as well as functions and effects thereof will be described.

The circuit structure of the present invention has a plurality of conductive path layers each having at least one conductive path capable of transmitting light or electricity therethrough, and at least one interlayer isolating layer formed between the plurality of conductive path layers. Each of a plurality of input/output (I/O) sections is connected to any one of the conductive paths. Each of the plurality of conductive path layers has a first laminated structure. The first laminated structure includes a plurality of first conductive layers and at least one first isolating layer formed between the plurality of first conductive layers. The interlayer isolating layer has a second laminated structure. The second laminated structure includes a plurality of second isolating layers and at least one second conductive layer formed between the plurality of second isolating layers. More specifically, the plurality of conductive path layers and the interlayer isolating layer formed therebetween are each formed from a lamination of conductive layers and isolating layers. Which level (a plurality of layers) of the lamination serve as a conductive path layer is determined according to the positions of the I/O sections.

This lamination is a lamination of conductive path layers (e.g., wiring layers) and at least one interlayer isolating layer (e.g., interlayer insulating layer). The conductive path layers (e.g., wiring layers) and the interlayer isolating layer (e.g., interlayer insulating layer) are each formed from a lamination of conductive layers and isolating layers. Therefore, this structure has a multi-layer structure. Typically, a plurality of conductive layers in each lamination are formed from substantially the same material, and a plurality of isolating layers are also formed from substantially the same material. Each lamination is typically formed as an alternate lamination of substantially the same conductive layers and substantially the same isolating layers. However, another layer may be formed between the conductive path layer (e.g., wiring layer) and the interlayer isolating layer.

For example, the conductive layers and the isolating layers in the lamination may be replaced with core layers and cladding layers, respectively. In this case, part of the lamination may be used as waveguide layers (waveguides), and an interlayer isolating layer may be formed therebetween. Which level of the lamination are used as a waveguide layer and which level of the lamination is used as an interlayer isolating layer are determined according to the positions of optical input/output (I/O) sections. Each level of the lamination having its core layers connected to a corresponding optical I/O section (first lamination) functions as a waveguide layer (waveguide), and the remaining level(s) (second lamination(s)) functions as an isolating layer for isolating the waveguide layers from each other.

Alternatively, the conductive layers and the isolating layers in the lamination may be replaced with electrically conductive layers and insulating layers, respectively. In this case, part of the lamination may be used as wiring layers (wirings) and an interlayer insulating layer may be formed therebetween.

Which level of the lamination is used as a wiring layer (wiring) and which level of the lamination is used as an interlayer insulating layer are determined according to the positions of input/output (I/O) electrodes. Each level of the lamination having its electrically conductive layers connected to a corresponding I/O electrode (first lamination) functions as a wiring layer, and the remaining level(s) (second lamination(s)) function as an interlayer insulating layer.

Since the insulating layer is formed between the electrically conductive layers of the lamination, no current flows in the direction normal to the layers of the lamination. In other words, a current flows only within the plane of each electrically conductive layer. If each wiring layer is regarded as a single conductor, the wiring layers of the lamination have anisotropic electrical conductivity. Since the lamination basically behaves as an anisotropic electrical conductor, a multi-layer structure can be easily produced without forming an additional insulating structure in the direction normal to the layers of the lamination. In other words, I/O electrodes for selecting an electrically conductive layer that is to function as a wiring layer need only be provided. For example, each I/O electrode contacts a plurality of electrically conductive layers of a corresponding wiring layer (first laminated structure) at the surface crossing the surfaces of the electrically conductive layers.

Since the circuit structure of the present invention has the above structure, the conductive path layers (wiring layers or waveguide layers) and the interlayer isolating layers (interlayer insulating layers or waveguide isolating layers) can be implemented with substantially the same laminated structure. Accordingly, the conductive path layers and the interlayer isolating layers need not be formed by separate processes, thereby simplifying manufacturing of the circuit structure. The conductive path layers need not necessarily be patterned. Particularly when the conductive path layers are used as wiring layers, part of the wiring layer located between the I/O electrodes connected to that wiring layer mainly functions as a wiring. It should be noted that, when the waveguide layers are formed, it is preferable to define the contour of the multi-layer structure to confine light two-dimensionally. It should be understood that two-dimensional spreading of light can be limited by using a side surface (also referred to as "end face") of the multi-layer structure. Note that the side surface of the lamination refers to any one of the surfaces defining the contour of the lamination, which extends in the direction crossing the surfaces of the layers of the lamination. The side surface is typically a flat surface, but may be a curved surface. The number of side surfaces is not limited.

Defining the contour of the multi-layer structure enables two-dimensional arrangement of the conductive paths (wirings or waveguides) to be defined. As a result, a plurality of electrically conductive paths can be formed in each conductive path layer (wiring layer or waveguide layer). The wiring structure of the present invention has a multi-layer structure. Therefore, the multi-layer structure of electrically conductive paths having a prescribed pattern can be formed without using a conventional photolithography process, printing method or transfer method. For example, by forming a laminated structure in a plurality of grooves formed in a substrate, the laminated structures in the grooves can be electrically or optically isolated from each other. In other words, appropriately setting the shape of the grooves enables formation of the resultant circuit structure having a plurality of wirings that are electrically isolated from each other or a plurality of waveguides that are optically isolated from each other.

The multi-layer structure can be formed by using various methods and various materials. When a material having liquidity at least in the forming process is used, a laminated structure can be easily formed in the grooves formed in the substrate. More specifically, the material need only be introduced in the grooves having a desired shape (depth and extending direction). When the wiring structure is produced, the use of a material that spontaneously forms an alternate laminated structure of electrically conductive layers and insulating layers further simplifies a manufacturing method.

For example, an electrically conductive smectic liquid crystal material has liquidity and forms an alternate laminated structure of electrically conductive layers and insulating layers. Therefore, the use of such a smectic liquid crystal material simplifies formation of the laminated structure in the grooves. In other words, this liquid crystal material need only be introduced into the grooves having a desired structure. Since the multi-layer circuit structure such as multi-layer wiring structure is produced by forming the laminated structure in the grooves, the patterning step that is conventionally required for every layer can be eliminated.

A smectic E phase liquid crystal material is particularly preferable because of its high electrical conductivity.

Moreover, hardening a smectic liquid crystal material enables formation of a stable wiring structure. A bilayer membrane of amphiphilic molecules may be used instead of the smectic material.

The wiring structure of the present invention may have a plurality of wiring layers, a plurality of interlayer insulating layers alternately laminated with the plurality of wiring layers, and a plurality of input/output (I/O) electrodes each connected to any one of the plurality of wiring layers, and each of the plurality of wiring layers may not substantially be patterned. In this wiring structure, each wiring layer functions as a single wiring. Instead of forming a plurality of wirings in each wiring layer by patterning, a plurality of wiring layers are formed so that each wiring layer serves as a single wiring. A current mainly flows through a portion of each wiring layer that is located between corresponding I/O electrodes, and this portion mainly functions as a wiring. Therefore, interference between the wiring layers can be prevented by appropriately setting the position of the portion connected to the I/O electrode for every wiring layer.

It should be understood that the I/O electrodes in the above description refer to electrodes to which a voltage is actually applied, and do not exclude an electrode that contacts the electrically conductive layer in the interlayer insulating layer. In other words, a plurality of electrodes may be provided so that every electrically conductive layer is connected to any one of the plurality of electrodes, and a voltage may be applied only to a selected one of the plurality of electrodes. In this case, various electrical connection patterns can be implemented by a single wiring structure including electrode arrangement.

Hereinafter, embodiments of the wiring structure and waveguide structure according to the present invention will be described with reference to the accompanying drawings.

(First Embodiment)

Figure 1B:
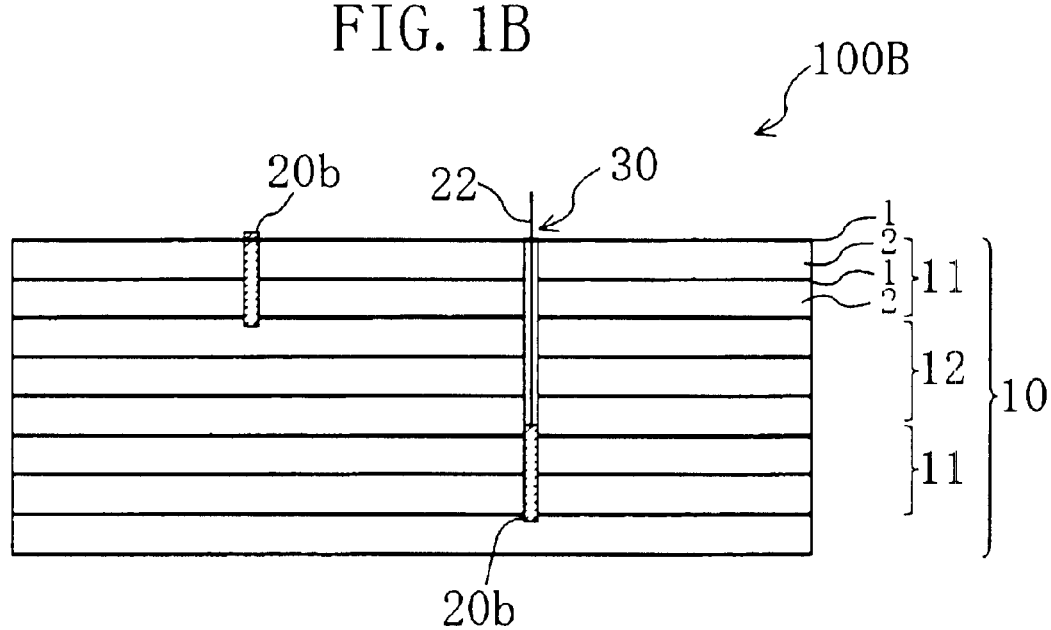

FIGS. 1A and 1B are schematic partial cross-sectional views of the wiring structure according to an embodiment of the present invention.

A wiring structure 100A of FIG. 1A has a lamination 10 and a plurality of input/output (I/O) electrodes 20a. The lamination 10 is an alternate lamination of a plurality of electrically conductive layers 1 and a plurality of insulating layers 2. Certain levels of the lamination 10 serve as wiring layers 11, and the remaining level(s) serves as an interlayer insulating layer(s) 12. Accordingly, the lamination 10 is also an alternate lamination of the wiring layers 11 and the interlayer insulating layer(s) 12.

Which level of the lamination 10 is used as a wiring layer (wiring) 11 and which level of the lamination 10 is used as an interlayer insulating layer 12 are determined according to the positions of the I/O electrodes 20a. Each level of the lamination 10 having its electrically conductive layers 1 connected to a corresponding I/O electrode 10 (i.e., first laminated structure) functions as a wiring layer 11. The remaining level(s) of the lamination 10 (i.e., second laminated structure(s)) functions as an interlayer insulating layer (s) 12. For example, each I/O electrode 20a contacts a plurality of electrically conductive layers 1 of a corresponding wiring layer (first laminated structure) 11 at the surface crossing the surfaces of the electrically conductive layers 1. In the illustrated example, each I/O electrode 20a contacts corresponding electrically conductive layers 1 at the end face of the electrically conductive layers 1 (i.e., at the side surface of the lamination 10).

A wiring structure 100B of FIG. 1B has I/O electrodes 20b. Each I/O electrode 20b contacts corresponding electrically conductive layers 1 within their planes. Each I/O electrode 20b connected to the electrically conductive layers 1 of a corresponding wiring layer 11 within the lamination 10 is formed in a hole 30 in the lamination 10. Preferably, the inner surface of the hole 30 (except the portion of the inner surface contacting the I/O electrode 20b) is covered with an insulating material, or the hole 30 is filled with an insulating material. The I/O electrode 20b is electrically connected to another electrode (not shown) through a lead wire 22.

Figure 2A:
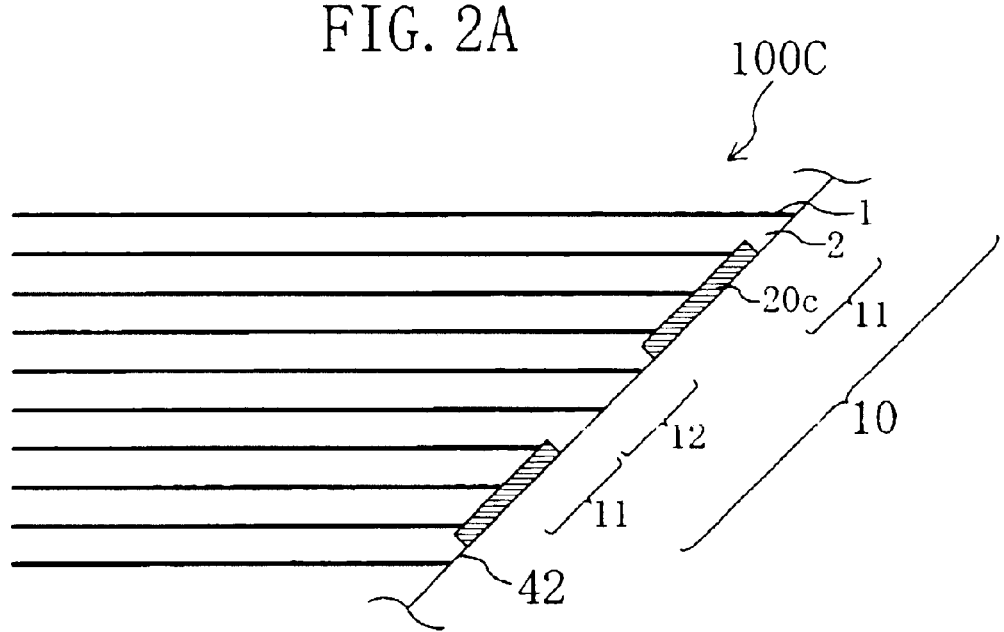
FIGS. 2A and 2B are schematic partial cross-sectional views of other wiring structures of the first embodiment.
Figure 2B:
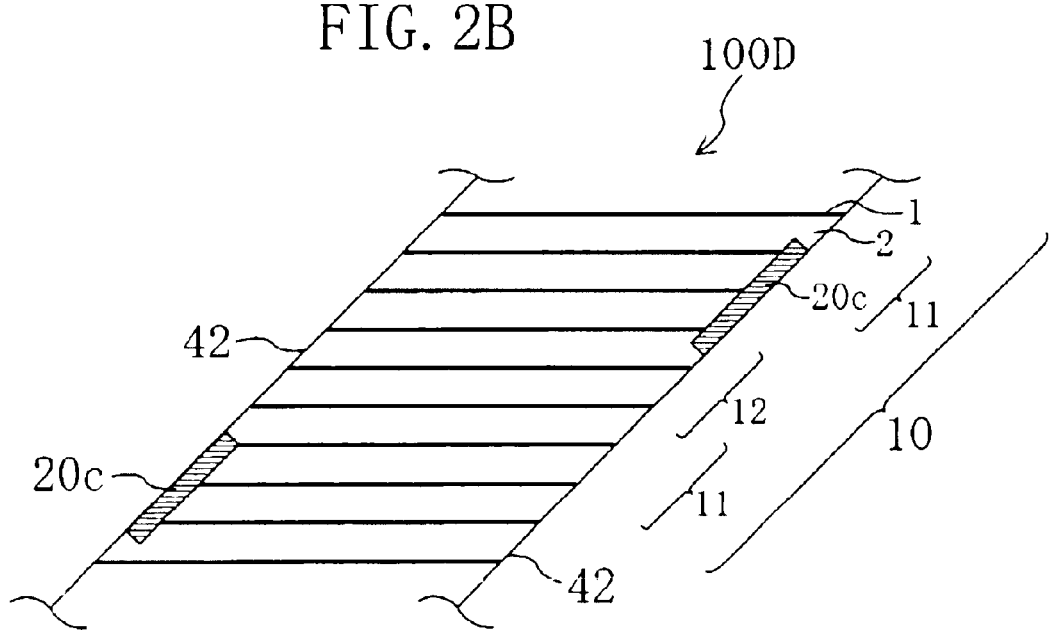

In wiring structures 100C, 100D of FIGS. 2A, 2B, I/O electrodes 20c are formed by using a slope 42 of a substrate (not shown). This facilitates formation of the I/O electrodes 20c that are electrically connected to the electrically conductive layer 1 in the respective wiring layers 11.

For example, the surface of a glass substrate may be tapered to form the slope 42. The plurality of I/O electrodes 20c formed on the slope 42 are respectively connected to the electrically conductive layers 1 of different levels. In other words, each I/O electrode 20c defines a wiring layer 11.

One side surface of the lamination 10 may contact the slope 42 as shown in FIG. 2A. Alternatively, a pair of opposing side surfaces of the lamination 10 may respectively contact the slopes 42 as shown in FIG. 2B. It should be understood that the lamination 10 may have various shapes including quadrangle and polygons when viewed from the direction normal to the layers of the lamination 10. Therefore, any side surface of the lamination 10 can be made in contact with the slope 42 so that the I/O electrodes 20c formed on the slope 42 can be electrically connected to the electrically conductive layers 1 in the respective wiring layers 11. Providing the I/O electrodes 20c on a plurality of side surfaces of the lamination 10 would reduce the number of I/O electrodes 20c on each side surface, resulting in an increased pitch of the I/O electrodes 20c. This is advantageous to manufacturing of a wiring structure having a multiplicity of I/O electrodes 20c.

Figure 3:
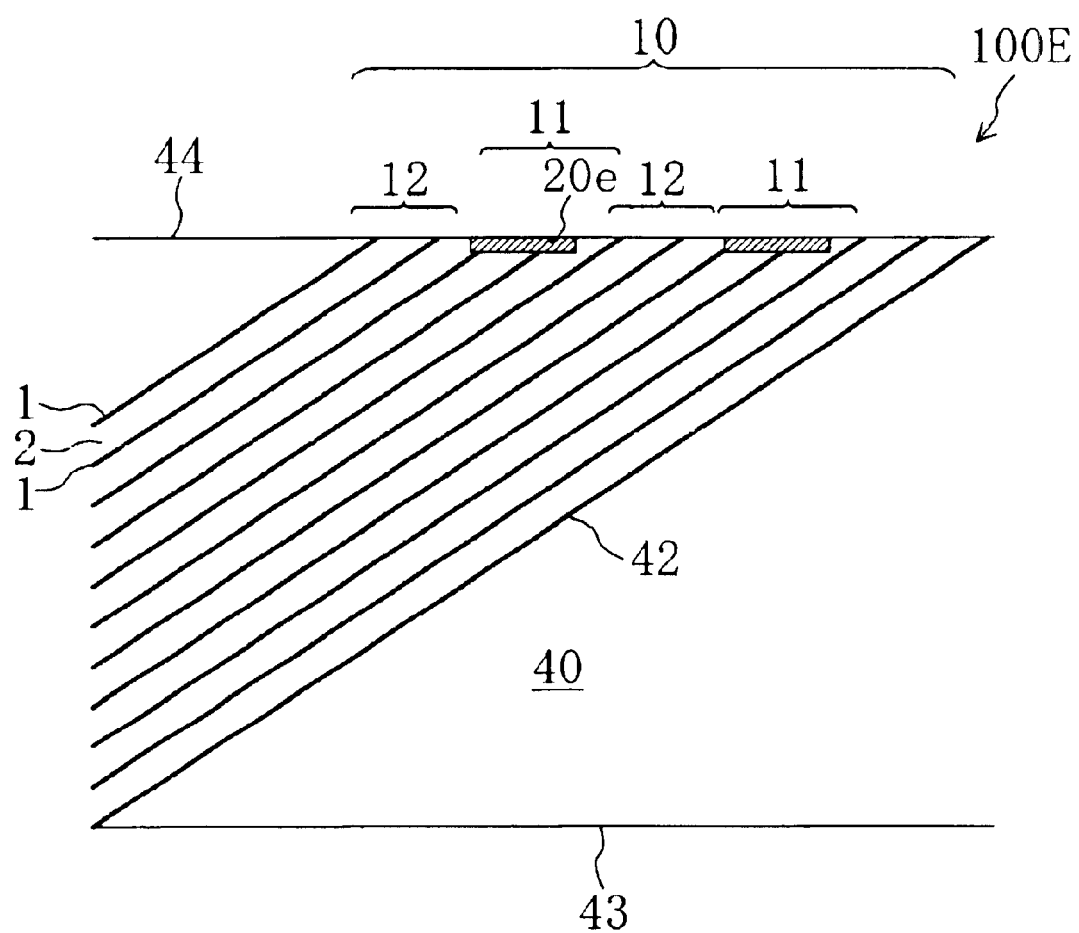
FIG. 3 is a schematic partial cross-sectional view of still another wiring structure of the first embodiment.

A wiring structure 100E of FIG. 3 is also possible. The wiring structure 100E has a lamination 10 of electrically conductive layers 1 and insulating layers 2 on a slope 42 of a substrate 40. The electrically conductive layers 1 and the insulating layers 2 extend in parallel with the slope 42. In other words, the laminating direction of the lamination 10 is the direction normal to the slope 42. A side surface of the lamination 10 extends in parallel with a bottom surface 43 of the substrate 40. I/O electrodes 20e are formed at a surface 44 that is in parallel with that side surface.

For example, the wiring structure 100E is produced by forming the lamination 10 on the slope 42 of the substrate 40 and then processing the side surface of the lamination 10 by a polishing method or the like. The side surface of the lamination 10 is not limited to a flat surface as illustrated, but may be any surface as long as the side surface crosses the surfaces of the electrically conductive layers 1. It should be understood that the side surface of the lamination 10 may be a stepped surface having a plurality of levels.

Figure 4:
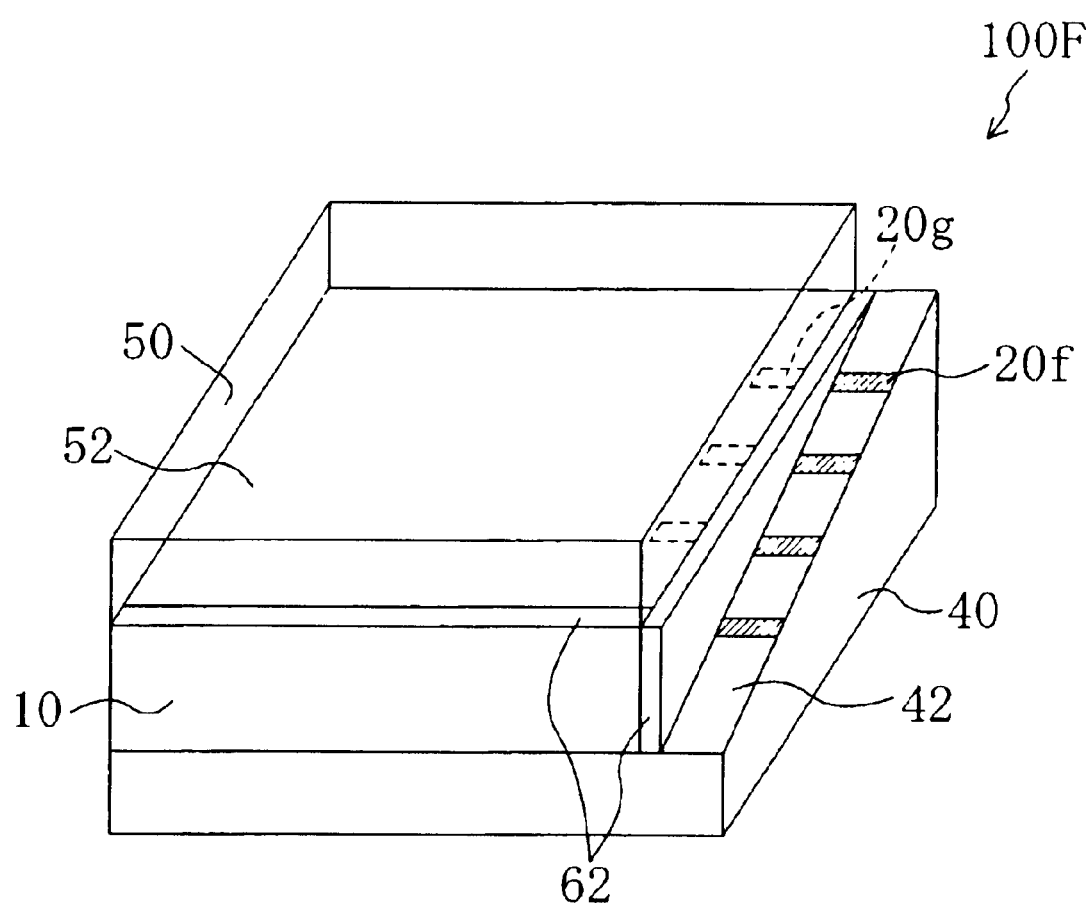
FIG. 4 schematically shows yet another wiring structure of the first embodiment.

For example, a wiring structure 100F of FIG. 4 can be formed based on the above wiring structure.

The wiring structure 100F has a substrate 40, an opposing substrate 50, and a lamination 10. The lamination 10 is formed in the space defined by the substrate 40, the opposing substrate 50 and a sealant 62. For example, the lamination 10 has the structure shown in FIG. 2A. In this case, electrically conductive layers (not shown) in wiring layers (not shown) of the lamination 10 are electrically connected to I/O electrodes 20f formed on a slope 42. Alternatively, the lamination 10 may have the structure shown in FIG. 3. In this case, the electrically conductive layers in the wiring layers are electrically connected to I/O electrodes 20g formed at a flat surface 52 of the opposing substrate 50.

A method for manufacturing the wiring structure of the present embodiment will now be described. The following description will be given for the wiring structure 100F of FIG. 4. It is herein assumed that the lamination 10 has the structure of FIG. 2A.

A known substrate (e.g., glass substrate or plastic substrate) having an insulating surface may be used as the substrate 40 and the opposing substrate 40. The I/O electrodes 20f are formed by a known method using a known electrically conductive material. For example, the I/O electrodes 20f are formed on the slope 42 of the glass substrate 40 at prescribed intervals by a printing method using an electrically conductive paste. The glass substrate 40 and the opposing substrate 50 are laminated each other with the sealant 62 to form the outer structure of the wiring structure 100F of FIG. 4.

The lamination 10 can be formed with various known materials. A liquid crystal material exhibiting a smectic E phase (SmE phase) is herein used. As well known in the art, smectic liquid crystal materials spontaneously form a layered structure. Individual layers of the layered structure are called "smectic layers". Of the smectic liquid crystal materials, a liquid crystal material exhibiting a SmE phase is preferable because of its excellent electrical conductivity.

Herein, 2-(4'-octylphenyl)-6-butoxynaphtalene (i.e., 8-PNP-O4) is prepared as a liquid crystal material exhibiting a SmE phase. For example, 8-PNP-O4 can be prepared by the synthesis method disclosed in Japanese Laid-Open Publication No. 2000-192042. The chemical structure of 8-PNP-O4 is as follows:

[Chemical formula 1]

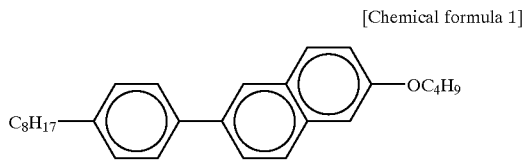

8-PNP-O4 exhibits a crystal phase at a temperature up to 55° C., a SmE phase in the range of 55° C. to 125° C., a smectic A phase (SmA phase) in the range of 125° C. to 129° C., and an isotropic liquid phase at 129° C. or higher.

Figure 5:
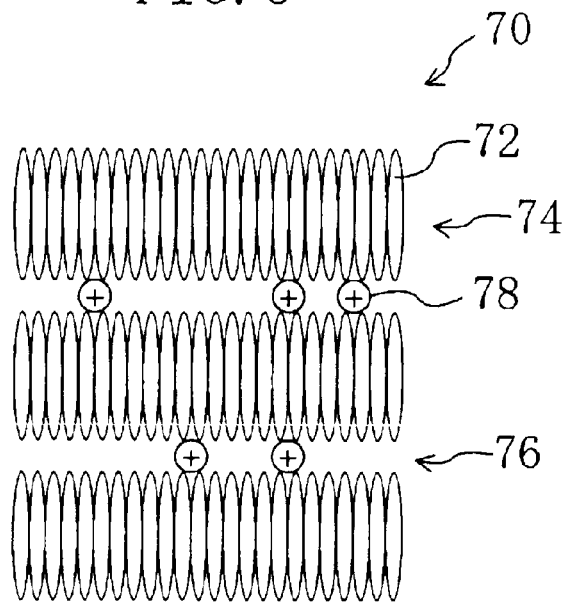
FIG. 5 schematically shows a lamination having a smectic layer structure, which is used in the wiring structure of the first embodiment.

While exhibiting the SmE phase, 8-PNP-O4 forms a lamination 70 schematically shown in FIG. 5. Bar-shaped liquid crystal molecules 72 arranged in parallel with each other form an individual smectic layer 74. A multiplicity of smectic layers 74 are stacked in the molecular-axis direction of the liquid crystal molecules 72. An interlayer region 76 is formed between every adjacent smectic layers 74. Each interlayer region 76 may serve as a channel that allows impurity ions to travel therethrough, as described later. Note that each smectic layer is formed from a monomolecular layer as illustrated in the figure. In general, however, each smectic layer may be substantially formed from a bilayer depending on the structure of the liquid crystal molecules.

The distance between adjacent liquid crystal molecules 72 is short in the in-plane direction of the smectic layer 74. Therefore, electronic conduction will occur due to hopping of the electrons or holes between the molecules (hopping conduction). In the direction normal to the smectic layers 74, however, such hopping conduction will not occur because of a long distance between the liquid crystal molecules 72. In other words, the liquid crystal material in a SmE phase is subjected to electronic conduction only in the in-plane direction of the smectic layer 74. Therefore, the liquid crystal material in a SmE phase can be regarded as an anisotropic electrical conductor. Moreover, each smectic layer 74 formed in the liquid crystal material in a SmE phase (in the strict sense, part of the liquid crystal molecules; mainly, a mesogenic portion) functions as an electrically conductive layer 1. Each interlayer region 2 (and part of the liquid crystal molecules that does not contribute to electronic conduction; mainly, a spacer portion) functions as an insulating layer 2. Accordingly, the smectic layer structure forms an alternate lamination 10 of electrically conductive layers 1 and insulating layers 2. Since each smectic layer has a molecular-level thickness, the lamination 10 has numerous electrically conductive layers 1 and insulating layers 2.

Note that, in order that a certain layer structure functions as the lamination 10 of the present invention, the electrical conductivity in the in-plane direction of the layer structure is preferably at least one order greater than that in the direction normal to the layers of the layer structure, and more preferably, at least three orders greater than that in the direction normal to the layers of the layer structure.

In the above wiring structures 100A to 100F, each wiring layer 11 includes a plurality of electrically conductive layers 1 and each interlayer insulating layer 12 includes a plurality of insulating layers 2. In other words, electrical conductivity of the wiring layer 11 depends on electrical conductivity of individual electrically conductive layers 1 and the number of electrically conductive layers 1 in the wiring layer 11. The same applies to the interlayer insulating layers 12. Accordingly, desired electrically conductive and insulating properties can be achieved by adjusting the number of electrically conductive layers 1 in each wiring layer 11 and the number of insulating layers 2 in each interlayer insulating layer 12. Such adjustment is conducted by appropriately setting the width (area) of the I/O electrodes and the distance therebetween.

A liquid crystal material is introduced into the outer structure of the wiring structure 100F thus formed. For example, the liquid crystal material is introduced from an inlet port (not shown) formed in the outer structure. In order to stably form the smectic layer structure, an alignment film for controlling the orientation direction of the liquid crystal molecules is preferably formed on the slope 42 of the substrate 40 and the surface 52 of the opposing substrate 50. The liquid crystal material is preferably introduced at a temperature of the isotropic liquid phase.

After the inlet port is sealed, the liquid crystal material is cooled to the temperature range of the SmE phase to form the lamination 70 that has a smectic layer structure functioning as the lamination 10 of FIG. 3. Of various liquid crystal phases, the SmE phase has high molecular orientational order and high viscosity. Therefore, mechanical stability of the smectic layer structure is better than that of the SmA phase.

Note that the slope 42 of the substrate 40 is preferably shaped (in terms of tilt angle, length and the like) so as to assure electrical connection with the I/O electrodes 20f while maintaining the smectic layer structure of the liquid crystal material (i.e., without causing disconnection of each smectic layer, or the like).

A liquid crystal material exhibiting a SmE phase is used in the above example. However, a liquid crystal material exhibiting another smectic layer (e.g., SmA phase, smectic B phase (SmB phase) or the like) may alternatively be used. It should be noted that hopping conduction is less likely to occur in the smectic phases other than the SmE phase. It is therefore preferable to add impurity ions (e.g., lithium ions) 78 in order to improve electrical conductivity. It should be understood that the impurity ions 78 may be added to the material exhibiting a SmE phase.

As schematically shown in FIG. 5, the ions 78 are more likely to travel within the interlayer region 76, but less likely to travel to an adjacent interlayer region 76 beyond the smectic layer 74. A possible reason for this is that the short distance between the liquid crystal molecules 72 in the smectic layer 74 allows the ions 78 to travel only in a small space. Accordingly, ionic conduction, charge transfer by the ions 78, occurs only within the interlayer regions 76. For ionic conduction, each interlayer region 76 functions as an electrically conductive layer 1 and each smectic layer 74 functions as an insulating layer 2. In other words, an alternate lamination of electrically conductive layers 1 and insulating layers 2 is produced.

In order to improve mechanical stability of the smectic layer structure of the above liquid crystal material, the liquid crystal material may be processed into a polymer liquid crystal material. For example, a polymer liquid crystal material can be obtained as follows: after photo-reactive functional groups are introduced into the liquid crystal molecules and the smectic layer structure is formed in the manner described above, the liquid crystal molecules are polymerized by light radiation. Alternatively, the liquid crystal material may be processed into a polymer liquid crystal material by using a mixture of the liquid crystal material and a photo-polymerizable compound. In this case, the photo-polymerizable compound is photo-polymerized after the liquid crystal material forms the smectic layer structure. As a result, the smectic layer structure is stabilized in the polymer network. Such processing of the liquid crystal material into a polymer liquid crystal material and stabilization of orientation of the liquid crystal molecules by the polymer network can be realized by a known method.

Figure 6:
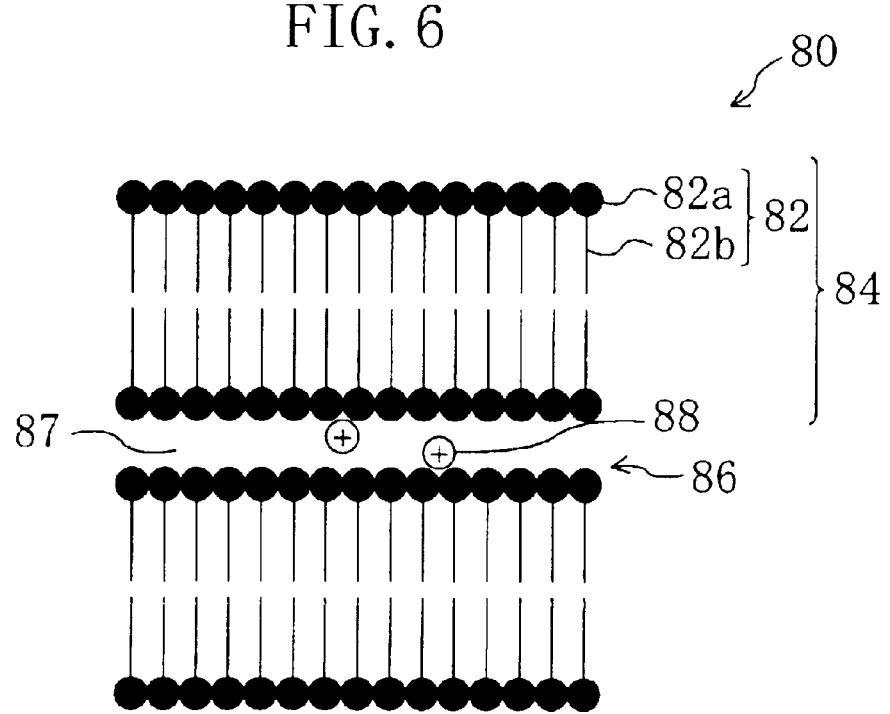
FIG. 6 schematically shows a lamination having a laminated structure of bilayer membranes, which is used in the wiring structure of the first embodiment.

In addition to the liquid crystal materials, a bilayer membrane of amphiphilic molecules (e.g., lipid bilayer membrane derived from an organism) may be used. A method for producing the wiring structure using a bilayer membrane will now be described with reference to FIG. 6.

A lamination 80 having a laminated structure of bilayer membranes is produced by repeatedly applying a solution containing amphiphilic molecules 82 to the surface of a solid. The lamination form of the bilayer membranes can be controlled by chemically modifying the surface of the solid. Various known methods can be used to form the laminated structure of bilayer membranes.

Each amphiphilic molecule 82 has a hydrophilic portion 82a and a hydrophobic portion 82b. The amphiphilic molecules 82 form a laminated structure having the hydrophilic portions 82a and the hydrophobic portions 82b each located adjacent to each other. This laminated structure is a lamination of bilayer membranes 84. An interlayer region 86 is formed between adjacent bilayer membranes 84. A solvent 87 is present in the interlayer region 86. In other words, the interlayer region 86 is interposed between the hydrophilic portions 82a having a high affinity to the solvent 87.

Electrically conductive property can be applied to the interlayer region 86 by introducing impurity ions (e.g., lithium ions) 88 into the lamination of the bilayer membranes 84. The ions 88 are not able to travel through the bilayer membrane 84 having an aggregation of the hydrophobic portions 82b. Therefore, no current will flow in the direction normal to the surfaces of the bilayer membranes 84. In other words, each interlayer region 86 functions as an electrically conductive layer 1 and each bilayer membrane 84 functions as an insulating layer 2. Therefore, like the above smectic layer structure, the laminated structure of the bilayer membranes is also an anisotropic electrical conductor. An alternate lamination of electrically conductive layers 1 and insulating layers 2 is thus obtained.

A smectic liquid crystal material and a solution containing amphiphilic molecules form the alternate lamination 70 or 80 of electrically conductive layers and insulating layers (i.e., anisotropic electrical conductor) by their self-organizing mechanism resulting from intermolecular interaction. This significantly simplifies manufacturing of the wiring structure. Moreover, these materials have liquidity (liquid crystal or solution) at least in the process of forming the lamination. As described later, this is advantageous in that the contour of the lamination can be easily defined by using a groove or the like. For example, the use of a plurality of grooves enables independent wirings (wiring layers) to be formed therein. Moreover, formation of a groove connecting the plurality of grooves enables the plurality of wirings to be connected together.

It should be understood that the lamination can also be formed by using a material having no self-organizing mechanism. In this case, electrically conductive layers and insulating layers need only be alternately formed by various known methods. The step of patterning the electrically conductive layers or forming the electrically conductive layers with a predetermined pattern in order to use each electrically conductive layer as a wiring is omitted. In other words, each electrically conductive layer is formed by substantially the same process, and each insulating layer is formed by substantially the same process. As a result, the manufacturing method is simplified.

Of the materials having no self-organizing function, a material having liquidity at least in the process of forming the lamination is preferably used for the above reason. Examples of the electrically conductive material that may have liquidity at least in the process of forming the lamination include an electrically conductive polymer and a mixture of a low melting metal (e.g., solder) or electrically conductive particles and a binder resin. Many materials including various polymer materials can be used as a material having both liquidity and insulating property.

A sol-gel method may be used to form an electrically conducive or insulating layer using a material having liquidity in the forming process. The electrically conductive layer can be formed from, e.g., ITO (Indium Tin Oxide) and the insulating layer can be formed from, e.g., $SiO_2$ or $TiO_2$. A material of each layer is first changed into the form of metal alkoxide and then chemically modified with acetylacetone to prepare a precursor solution. A film of this solution is formed on the substrate by a spin coating method, a dip method or the like. This film is changed into an oxide film through hydrolysis and polycondensation reaction. An alternate laminated structure of insulating layers and electrically conductive layers can be produced by alternately repeating the above process by using two kinds of materials.

It should be understood that a lamination can be formed from a material having no liquidity by using thin film formation technology (dry process) such as sputtering method and CVD (Chemical Vapor Deposition) method. For example, an alternate lamination of $Al_2O_3$ and Al can be formed by ON-OFF controlling introduction of oxygen gas into a chamber while sputtering Al by a sputtering method.

Figure 7:
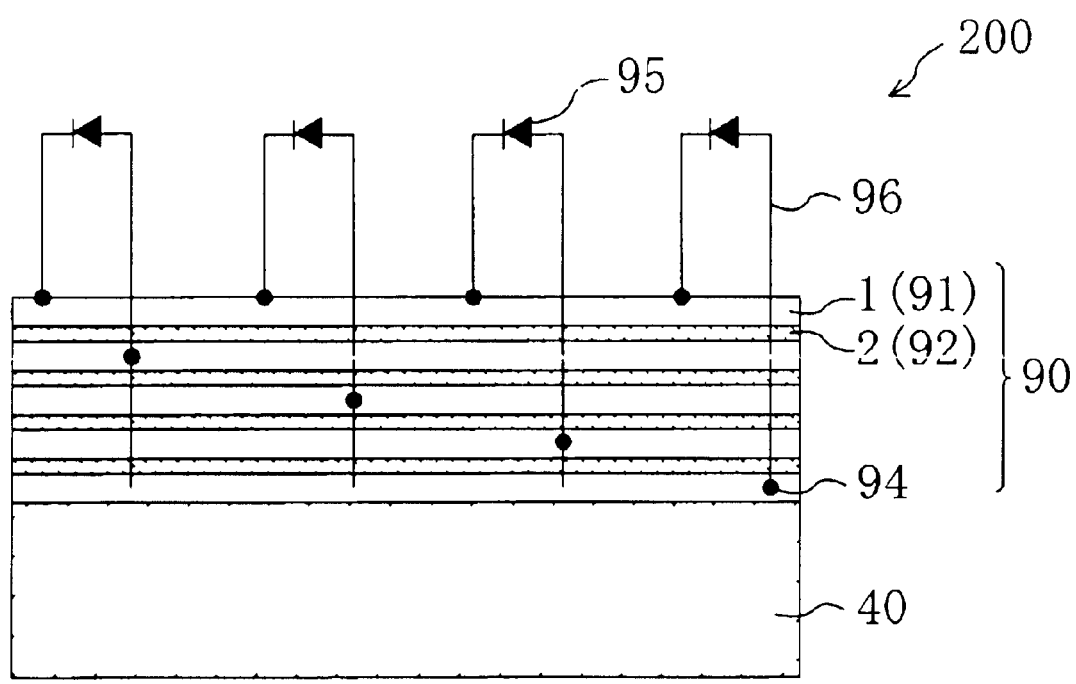
FIG. 7 schematically shows a further wiring structure of the first embodiment.

The above description is given for the wiring structure that includes a lamination 10 of the wiring layers 11 and the interlayer insulating layers 12 as shown in, e.g., FIG. 1B. In this lamination 10, each wiring layer 11 includes a plurality of electrically conductive layers 1 and each interlayer insulating layer 12 includes a plurality of insulating layers 2. However a wiring structure 200 of FIG. 7 is also possible.

A lamination 90 of the wiring structure 200 includes a plurality of wiring layers 91 and a plurality of interlayer insulating layers 92. Each wiring layer 91 includes only one electrically conductive layer 1, and each interlayer insulating layer 92 includes only one insulating layer 2. Each electrically conductive layer 1 is not patterned, and functions as a single wiring. At least one I/O electrode 94 is provided for each wiring layer 91. Each I/O electrode 94 is connected to a corresponding LED (Light Emitting Diode) 95 through a corresponding lead wire 96. Each LED 95 is connected to corresponding two I/O electrodes 94 through two lead wires 96, respectively. One of two terminals of each LED 95 is connected to the I/O electrodes 94 formed in a common wiring layer 91 (in the illustrated example, a wiring layer 91 formed at the surface).

For example, the structure of FIG. 7 can be manufactured as described below. For simplicity, it is herein assumed that there are four LEDs 95.

By using a sol-gel method, five ITO wiring layers 91 and four $SiO_2$ interlayer insulating layers 92 are alternately formed on the surface of a substrate 40 to produce the lamination 90. Each layer has a thickness of, e.g., 1 µm.

Four holes having a prescribed depth are then formed at prescribed positions of the lamination 90. In the illustrated example are formed four holes (not shown) reaching the wiring layer 91 located right above the substrate 40. One lead wires 96 respectively connected to the four LEDs 95 are connected to the wiring layer 91 formed at the surface, and the other lead wires 96 are respectively connected to different wiring layers 91 of the lamination 90. For example, linear conductors covered with an insulating material may be used as lead wires 96. In this case, the insulating material on each conductor is partially removed so as to expose the conductor surface. More specifically, the insulating material is removed at the tip of the lead wire 96 or at the position corresponding to the level of a prescribed wiring layer 91 (i.e., the position located at a prescribed distance from the bottom of the hole). By inserting such lead wires 96 into the respective holes in the lamination 90, the lead wires 96 contact the respective wiring layers 91 at their respective exposed portions, thereby forming electrical connection. The exposed portions of the lead wires 96 respectively function as the I/O electrodes 94.

The array of LEDs 95 connected to the wiring structure 200 can be controlled with a voltage applied to each wiring layer 91 from the side surface of the lamination 90. The LEDs 95 can be controlled independently of each other. In other words, the wiring structure capable of controlling four LEDs 95 independently is obtained without patterning the wiring layers to form wirings. It should be understood that not only the wiring structure for the LED array but also wiring structures for various devices can be provided.

The wiring structure 200 can be formed by using a method other than the sol-gel method and by using other materials. For example, the wiring structure 200 may have a lamination of copper foil and polyimide film. It should be noted that the use of a material that spontaneously forms an alternate lamination of electrically conductive layers and insulating layers often results in insufficient conductive or insulating property of each layer. It is therefore preferable to form each wiring layer and each interlayer insulating layer from a plurality of layers (electrically conductive layers and/or insulating layers). It should be understood that the wiring structures such as 100A and 200 may be combined as necessary.

(Second Embodiment)

Figure 8A:
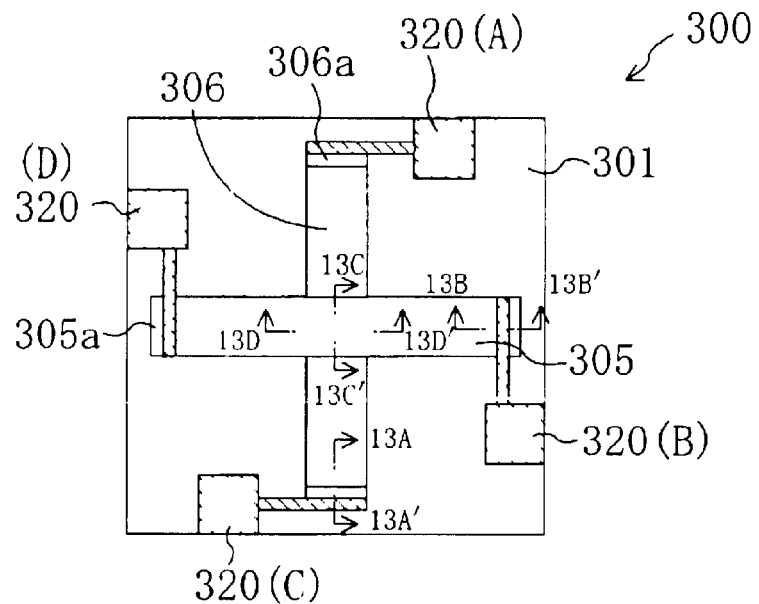
FIGS. 8A and 8B schematically show a wiring structure according to a second embodiment of the present invention.
Figure 8B:
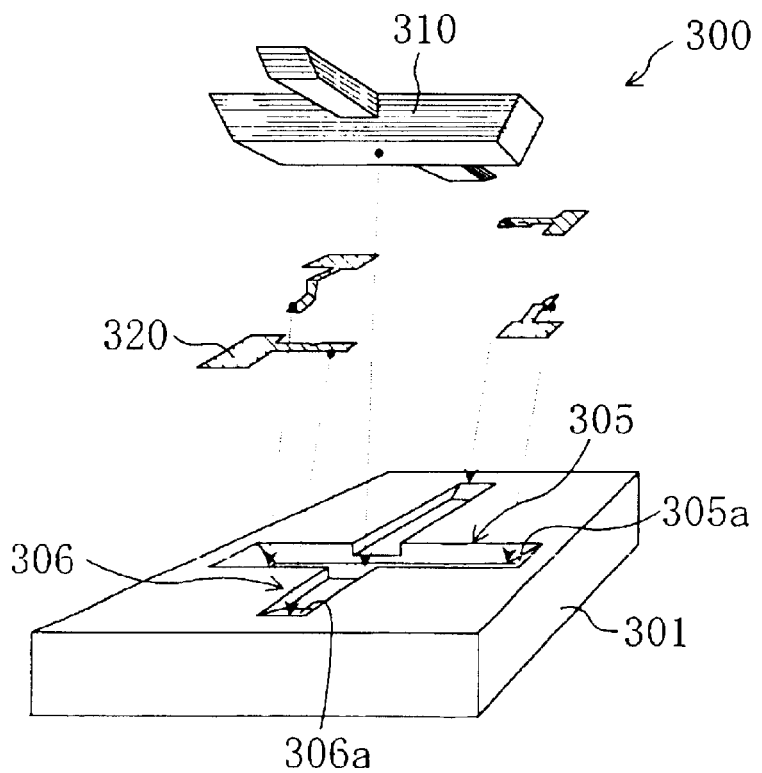

In the second embodiment, a wiring structure that defines the contour by using a groove will be described. FIGS. 8A and 8B schematically show the wiring structure 300 of the second embodiment. FIG. 8A is a top view and FIG. 8B is an exploded perspective view.

The wiring structure 300 has a lamination 310 formed in grooves 305 and 306 in a substrate 301. For example, a plastic substrate can be preferably used as the substrate 301.

The grooves 305, 306 cross each other, and have different depths. In the illustrated example, the groove 305 is deeper than the groove 306. The grooves 305, 306 have tilted side surfaces (slopes 305a, 306a) at the ends (i.e., the ends in the extending direction of the grooves 305a, 306a). The other side surfaces of the grooves 305, 306 extend in parallel with the normal line of the substrate 301, and the bottom surfaces thereof extend in parallel with the plane defined by the substrate 301.

A terminal electrode (corresponding to "I/O electrode") 320 is formed at least in part of each slope 305a, 306a of the grooves 305, 306. The terminal electrodes 320 formed at the grooves 305, 306 have different depths (the "depth" corresponds to the level in the lamination 310). In other words, adjusting the depths of the terminal electrodes 320 allows different levels in the lamination 310 to function as wiring layers. Hereinafter, an example of forming the lamination 310 by using the above SmE phase liquid crystal material will be described.

Figure 9A:
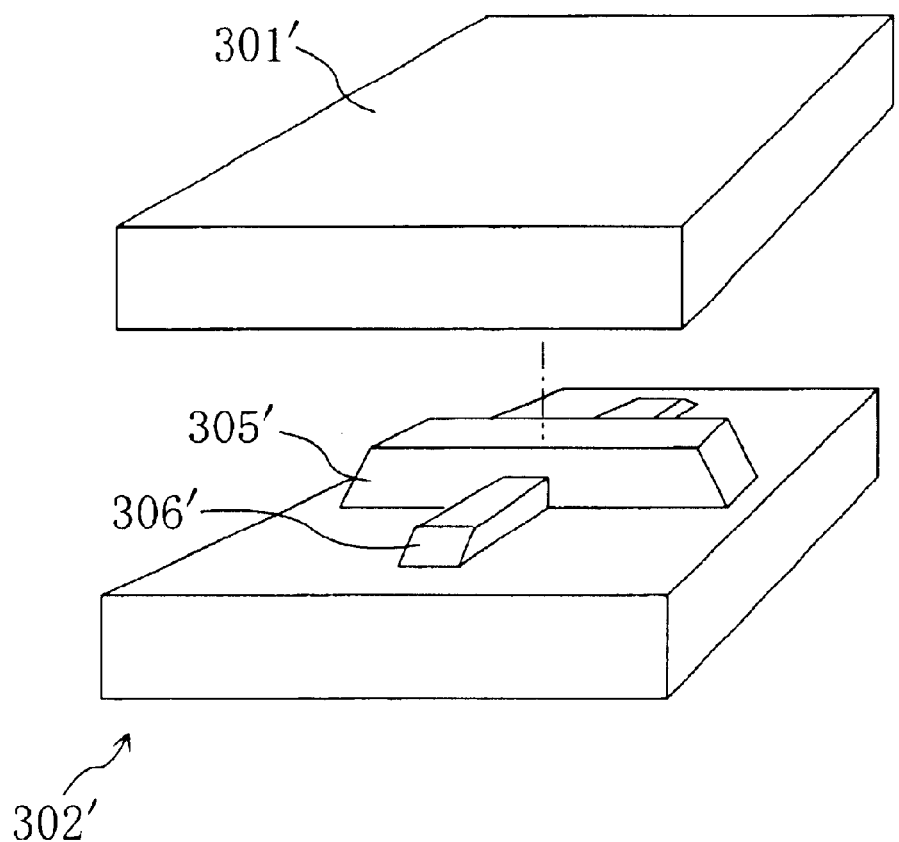
FIGS. 9A and 9B illustrate a manufacturing process of the wiring structure in FIGS. 8A and 8B.

For example, the wiring structure 300 can be manufactured as follows:

First, as shown in FIG. 9A, a plastic substrate 301' having a thermoplastic property and a mold 302' are prepared. The mold 302' has two projecting portions 305', 306' at its surface. Each projecting portion 305', 306' has a width of 100 µm. The projecting portions 305', 306' cross each other. For example, the projecting portion 305' has a height of 200 µm and the projecting portion 306' has a height of 100 µm.

Figure 9B:
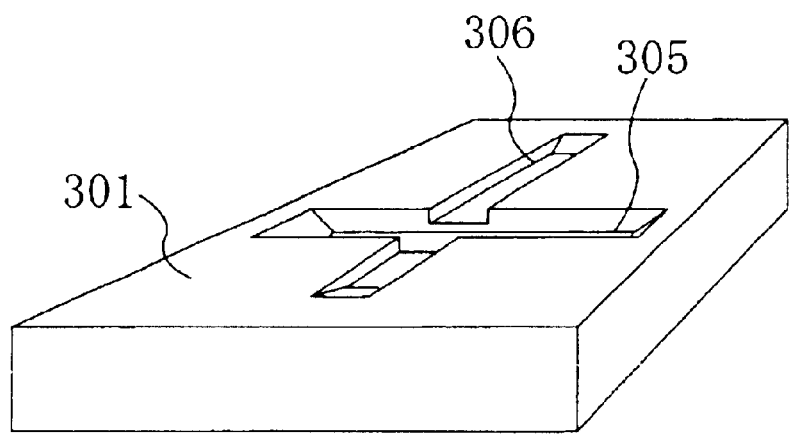

The plastic substrate 301' and the mold 302' are heated to, e.g., 180° C. and the mold 302' is pressed against the plastic substrate 301'. The plastic substrate 301' is then slowly separated from the mold 302'. As a result, as shown in FIG. 9B, the shapes of the projecting portions 305', 306' of the mold 302' are transferred to the plastic substrate 301'. The plastic substrate 301 having two crossing grooves 305, 306 is thus produced.

The substrate 301 having the grooves 305, 306 can be easily formed by embossing the plastic substrate as described above. However, the present invention is not limited to this. The substrate 301 having the grooves 305, 306 may be formed by using an injection molding method or the like. Alternatively, the grooves may be formed by etching or machining a glass substrate.

The terminal electrodes 320 are then formed at prescribed positions of the slopes 305a, 305b of the grooves 305, 306 of the substrate 301 (see FIG. 8A). The terminal electrodes 320 can be formed by using a printing method, a transfer method or a photolithography method. The terminal electrodes 320 can be formed from a known electrically conductive material such as metal and conductive paste.

Thereafter, the plastic substrate 301 is immersed in, e.g., a DMOAP solution, one of the vertical alignment film materials. The plastic substrate 301 is then removed from the solution and dried. In this process, a vertical alignment film (not shown) is formed on the surface of the plastic substrate 301. It should be understood that the vertical alignment film may be formed from another material. Depending on the material of the substrate 301, liquid crystal molecules can be vertically oriented by merely cleaning the surface of the substrate 301.

Figure 10A:
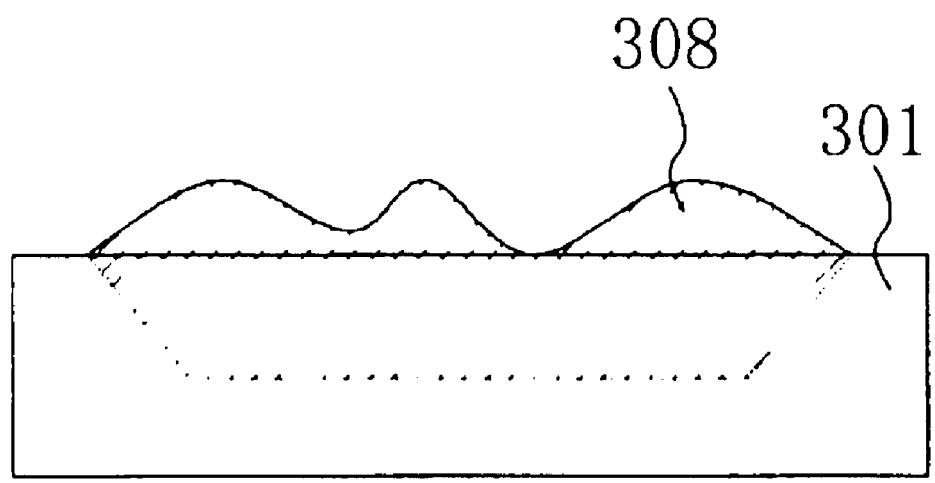
FIGS. 10A and 10B illustrate a manufacturing process of the wiring structure in FIGS. 8A and 8B.
Figure 10B:
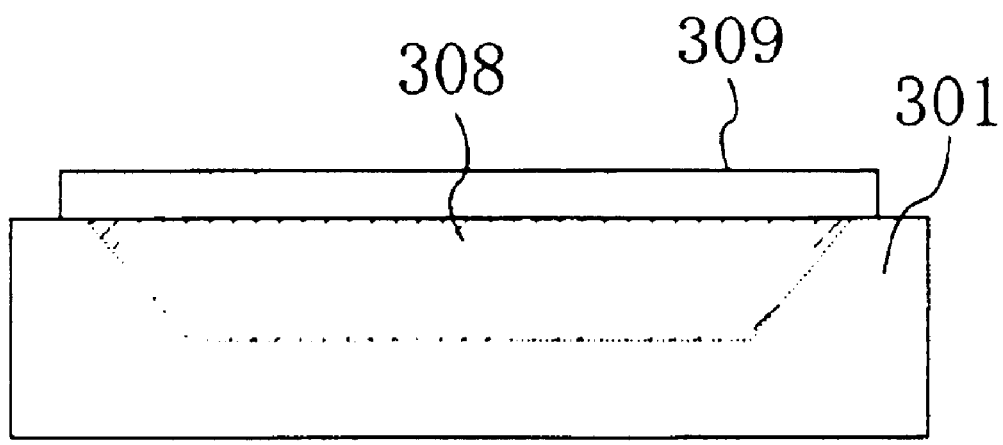

Thereafter, as shown in FIG. 10A, a SmE phase liquid crystal material (e.g., 8-PNP-O4) 308 is introduced into the grooves 305, 306 of the substrate 301 at a temperature of the isotropic liquid phase. As shown in FIG. 10B, a flat substrate 309 may then be placed over the substrate 301 in order to seal the liquid crystal material 308 within the grooves 305, 306. In this process, an overflowing liquid crystal material 308 can be easily removed.

Figure 11A:
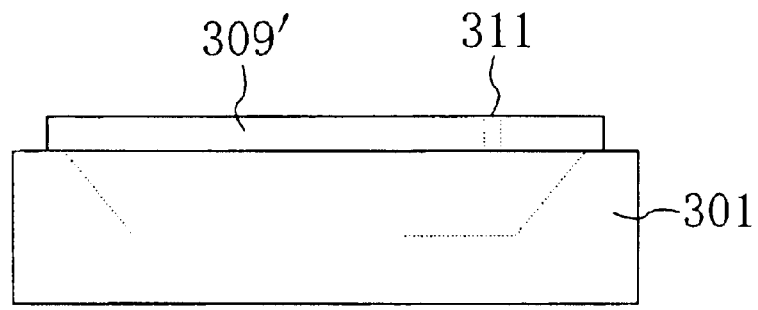
FIGS. 11A and 11B illustrate a manufacturing process of the wiring structure in FIGS. 8A and 8B.
Figure 11B:
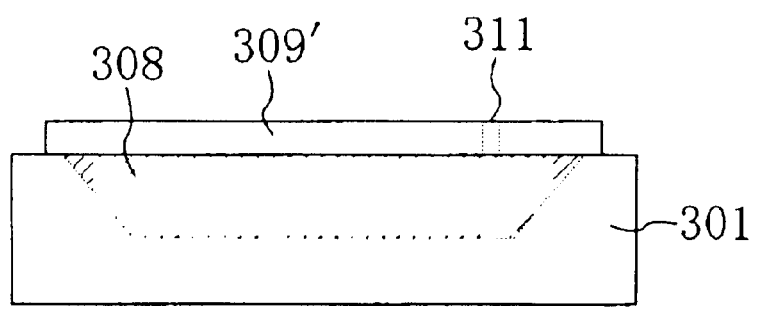

Alternatively, as shown in FIGS. 11A and 11B, a flat substrate 309' subjected to an alignment process with DMOAP or the like may be laminated with the substrate 301 in order to form a substantially sealed space for forming the lamination 310. The liquid crystal material 308 may be introduced into the space from an inlet port 311 formed in advance in the flat substrate 309'.

Figure 12:
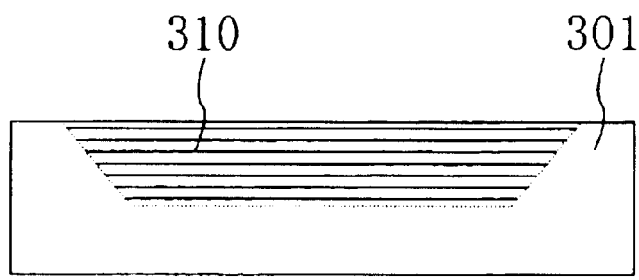
FIG. 12 illustrates a manufacturing process of the wiring structure in FIGS. 8A and 8B.

As described above, the liquid crystal material 308 filled within the grooves 305, 306 is cooled to a temperature of the SmE phase. The lamination 310 having a smectic layer structure as shown in FIG. 12 is thus formed within the grooves 305, 306. The smectic layer structure of the lamination 310 is substantially the same as that of the lamination 70 in FIG. 5. Therefore, description of the characteristics thereof is omitted herein. Note that introducing the liquid crystal material at a temperature of the isotropic liquid phase and then gradually cooling it to a temperature of the SmE phase enables stable formation of the layered structure of the SmE phase with excellent reproducibility.

Figure 13A:
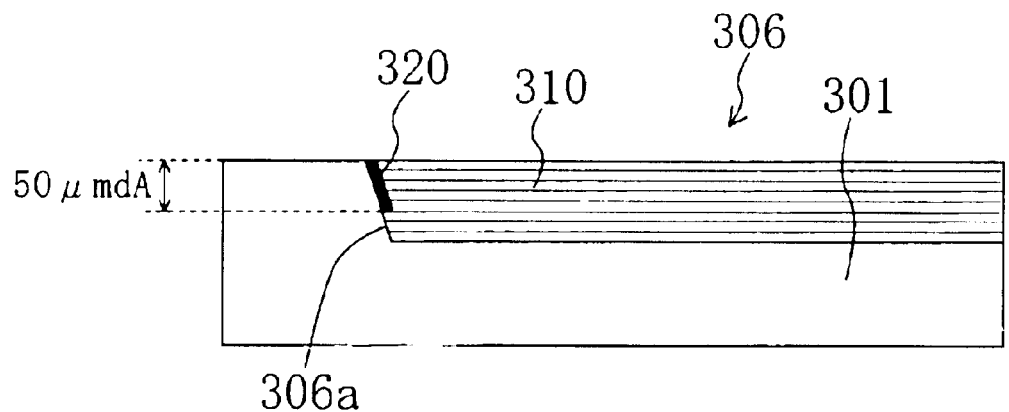
FIG. 13A illustrates the structure of a terminal electrode portion of the wiring structure in FIGS. 8A and 8B.
Figure 13B:
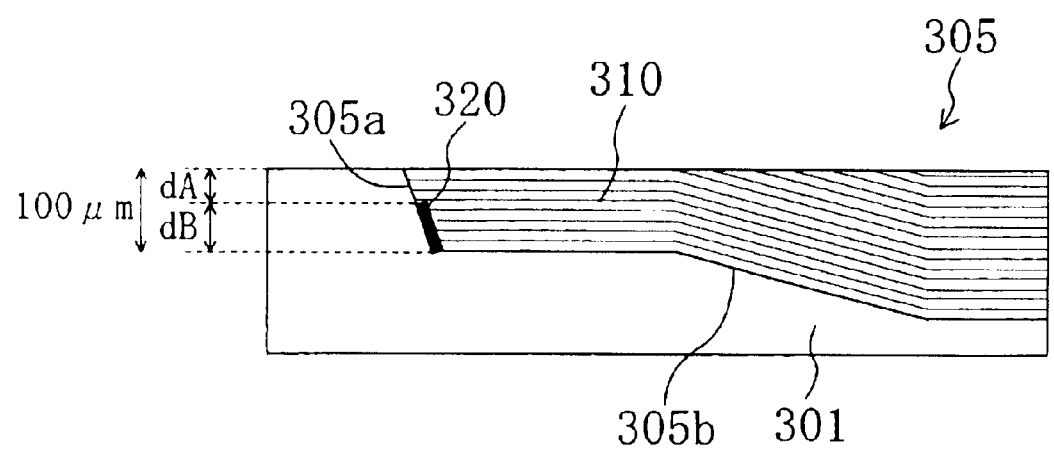
FIG. 13B illustrates the structure of another terminal electrode portion of the wiring structure in FIGS. 8A and 8B.

The structure around the terminal electrodes 320 will now be described with reference to FIGS. 13A, 13B. FIG. 13A is a cross-sectional view taken along line 13A–13A' in FIG. 8A and FIG. 13B is a cross-sectional view taken along line 13B–13B' in FIG. 8A.

As shown in FIG. 13A, the terminal electrode 320 formed on the slope 306a of the groove 306 contacts only an upper level dA of the lamination 310. On the other hand, as shown in FIG. 13B, the terminal electrode 320 formed on the slope 305a of the groove 305 contacts only a lower level dB of the lamination 310. On the slopes 305a, 306a located at the other ends of the grooves 305, 306, the terminal electrodes 320 are similarly formed at the levels shown in FIGS. 13A, 13B, respectively.

Figure 13C:
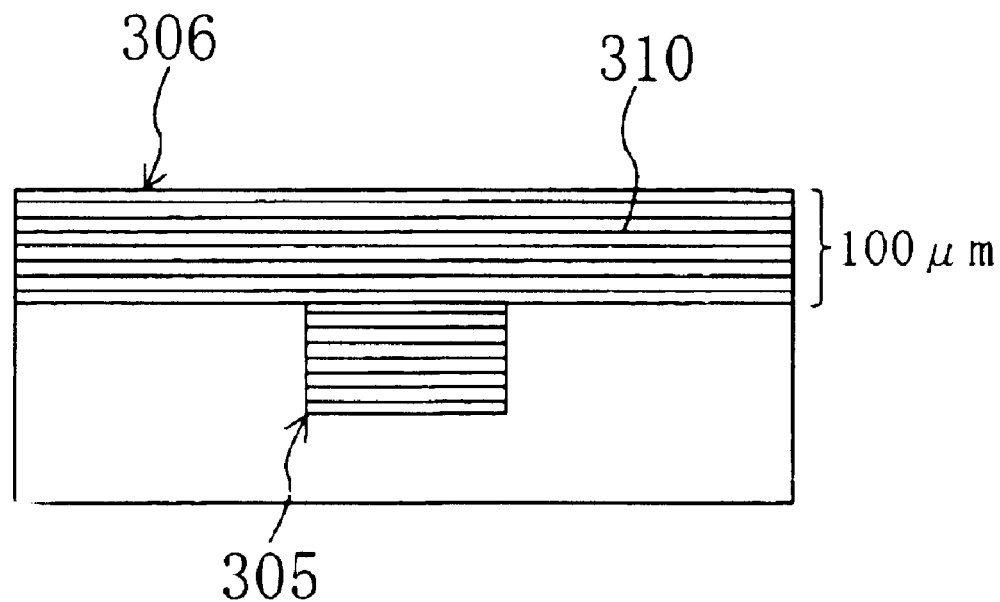
FIG. 13C illustrates part of the structure of a lamination in the wiring structure in FIGS. 8A and 8B.
Figure 13D:
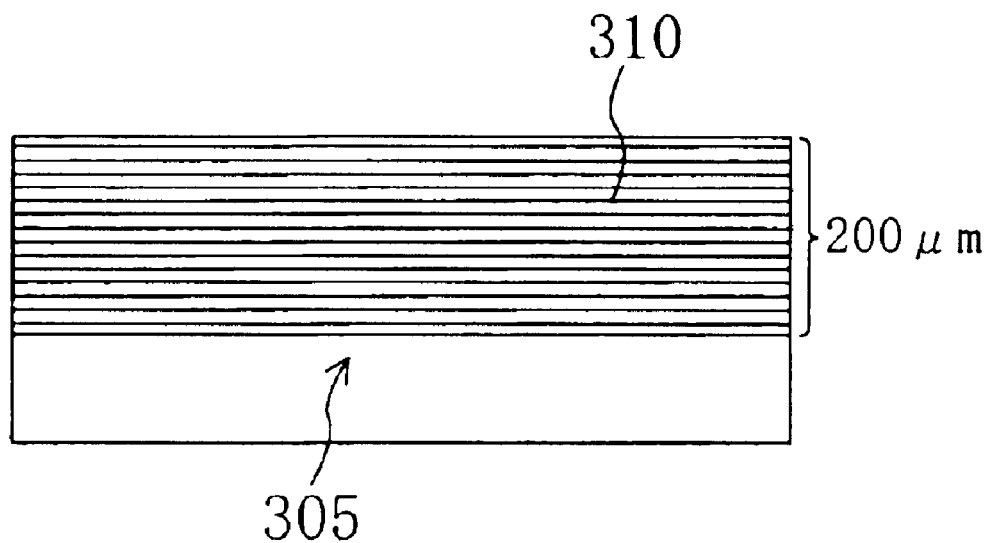
FIG. 13D illustrates another part of the structure of a lamination in the wiring structure in FIGS. 8A and 8B.

The structure of the intersection of the grooves 305, 306 will now be described with reference to FIGS. 13C, 13D. FIG. 13C is a cross-sectional view taken along line 13C–13C' in FIG. 8A and FIG. 13D is a cross-sectional view taken along line 13D–13D' in FIG. 8A.

The intersection where the groove 305 has a depth of 200 μm will now be considered. A smectic layer located at the lowest level (thickness: 50 μm) of the lamination 310 corresponds to the portion dB in FIG. 13B. This smectic layer functions as a wiring layer that connects the two terminal electrodes 320(B), 320(D) formed on the slopes 305a of the groove 305 to each other. A smectic layer located at the highest level (thickness: 50 μm) of the lamination 310 corresponds to the potion dA in FIG. 13A. This smectic layer functions as a wiring layer that connects the two terminal electrodes 320(A), 320(C) formed on the slopes 306a of the groove 306 to each other.

A smectic layer in the intermediate portion (thickness: 100 μm) of the groove 305 functions as an interlayer insulating layer that is not involved in any conduction. This interlayer insulating layer assures electrical insulation between the wiring layer for connecting the two terminal electrodes 320(A), 320(C) on the slopes 306a of the groove 306 and the wiring layer for connecting the two terminal electrodes 320(B), 320(D) on the slopes 305a of the groove 305.

The groove 305 need not have a depth of 200 μm across the entire region. For example, as shown in FIG. 13B, the groove 305 may have a shallower portion near the terminal electrode 320. In this case, the upper smectic layer in the groove 305 is pushed up along a tapered portion 305b of the bottom of the groove 305 and thus does not contact the terminal electrode 320. In other words, the lower smectic layer of the lamination 310 reaches the terminal electrode 320 along the bottom surface. Note that the tapered portion 305b of the bottom of the groove 305 is preferably shaped (in terms of tilt angle, length and the like) so that the smectic layer in the groove 305 can be reliably electrically connected to the terminal electrode 320 along the tapered portion 305b while maintaining the layered structure (i.e., without causing disconnection or the like).

The wiring structure 300 having a function as two crossing wirings is thus produced. Substantially two wirings are formed by a single step of filling the grooves 305, 306 of different depths with a smectic liquid crystal material. This is because, like the lamination 70 of FIG. 5, the lamination 310 is an anisotropic electrical conductor that does not substantially allow a current to flow in the direction normal to the layers of the lamination 310. Moreover, the step of forming an interlayer insulating film for insulating the two crossing wirings can be omitted.

Hereinafter, a method for manufacturing a wiring structure 350 will be described. The wiring structure 350 has two wirings crossing other two wirings.

Figure 14A:
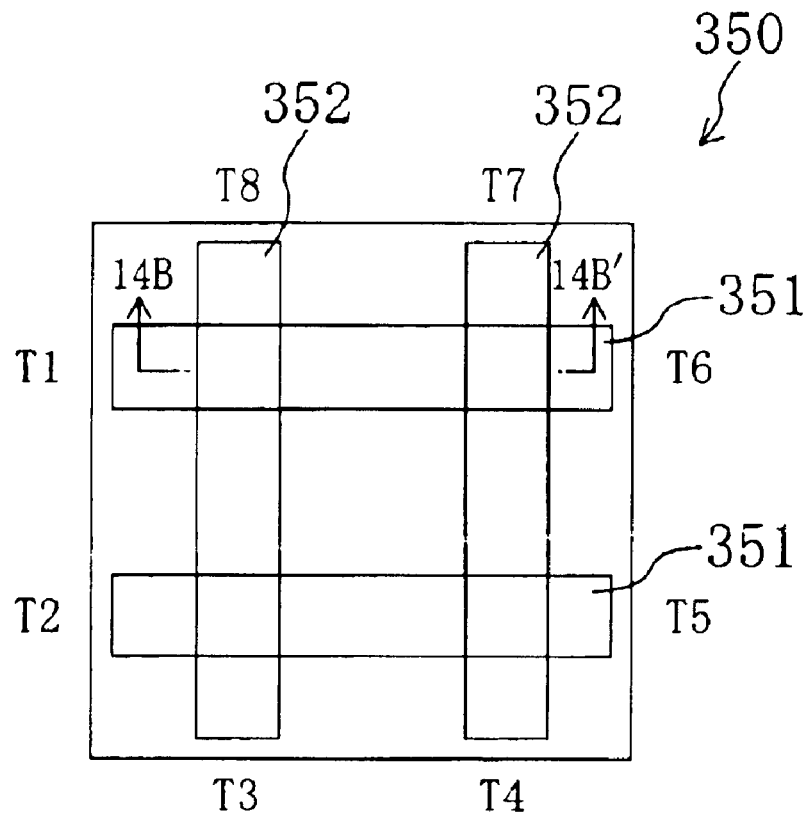
Figure 14B:
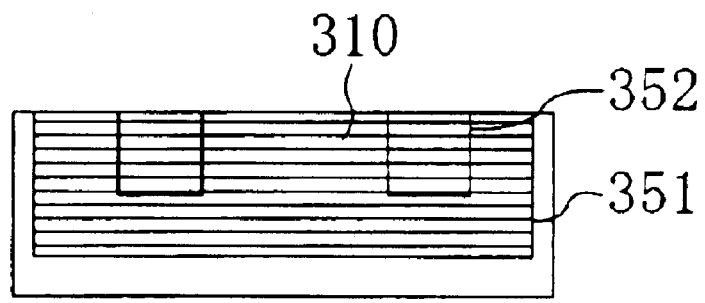
Figure 15:
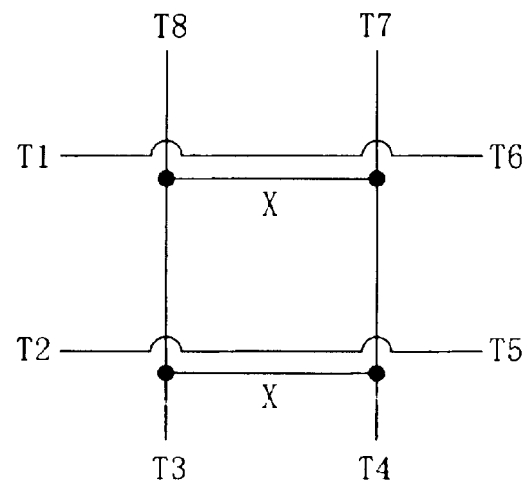
FIG. 15 is an equivalent circuit diagram of the wiring structure in FIGS. 14A and 14B.
Figure 16:
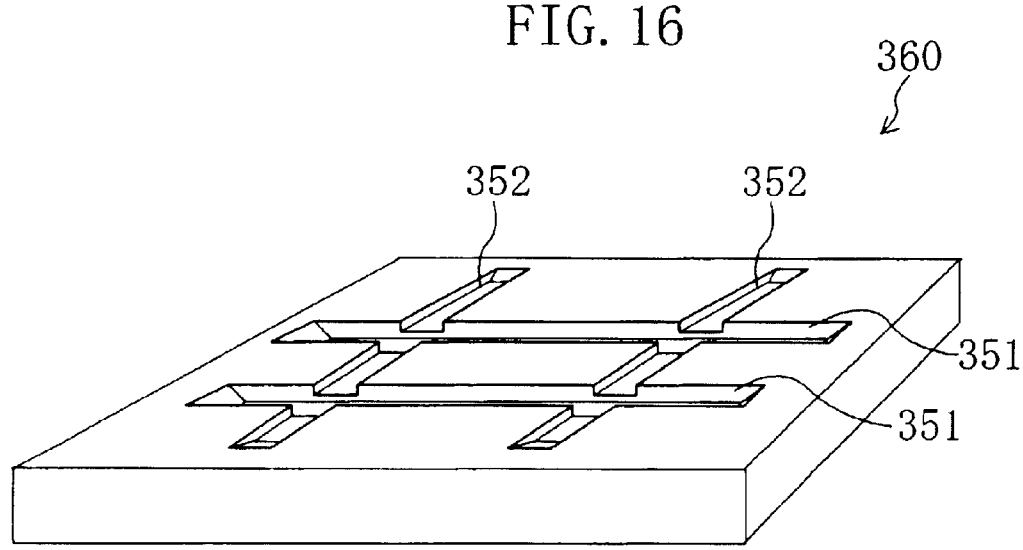
FIG. 16 is a perspective view of a substrate used in the wiring structure in FIGS. 14A and 14B.

FIG. 14A shows a top view of the wiring structure 350 and FIG. 14B is a cross-sectional view taken along line 14B–14B' in FIG. 14A. FIG. 15 is an equivalent circuit diagram of the wiring structure 350. FIG. 16 is a perspective view of a substrate 360 used in the wiring structure 350.

First, a two-by-two structure (i.e., two grooves 351, 351 by two grooves 352, 352) is formed in the substrate 360 according to the manufacturing process of the wiring structure 300 (see FIG. 16). The grooves 351 are deeper than the grooves 352 (see FIG. 14B).

When a wiring is formed at the lower level of the lamination 310 in each groove 351 (i.e., in the deep portion of each groove 351), the respective wirings in the grooves 351 are insulated from each other. In other words, two wirings T1-T6 and T2-T5 in FIG. 15 are independent of each other.

Figure 17:
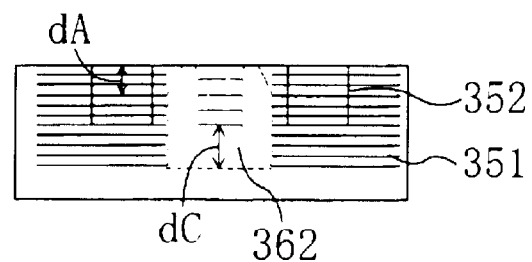
FIG. 17 is a partial cross-sectional view of a lamination used in the wiring structure in FIGS. 14A and 14B.

On the other hand, when a wiring is formed at the upper level of the lamination 310 in each groove 352 (i.e., in a shallow portion of each groove 352, a portion dA in FIG. 17), the respective wirings in the grooves 352 are electrically connected to each other. In other words, wirings including points X would be formed between two wirings T3-T8, T4-T7 in FIG. 15. In order to prevent electrical connection between the two wirings formed at the upper level of the grooves 352, the smectic layer at the upper level of the lamination 310 must be disconnected at the points X in FIG. 15. Methods for preventing electrical connection between adjacent wirings formed at the upper level of the lamination 310 will now be described.

According to a fist method, as shown in FIG. 17, a projection 362 is formed at the bottom surface of each groove 351 at a position between the intersections of the groove 351 and the adjacent two grooves 352 (i.e., at a position corresponding to the point X in FIG. 15). The height dC of the projection 362 is larger than the thickness dA of the upper layer serving as a wiring in the groove 352. As a result, the smectic layer formed at the upper level of the lamination 310 in one groove 352 is disconnected from that in the other groove 352 at the points X in FIG. 15.

Figure 18A:
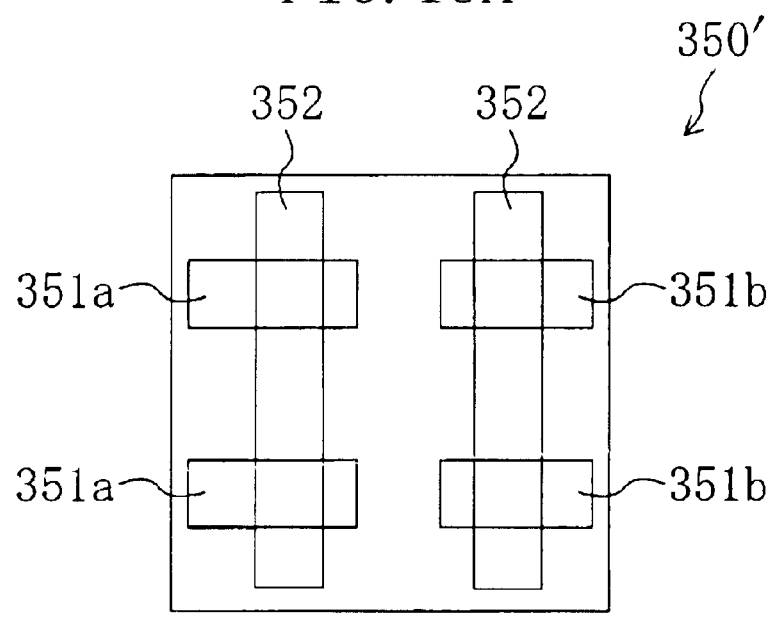
FIG. 18A is a top view of still another wiring structure of the second embodiment (terminal electrode are not shown)
Figure 18B:
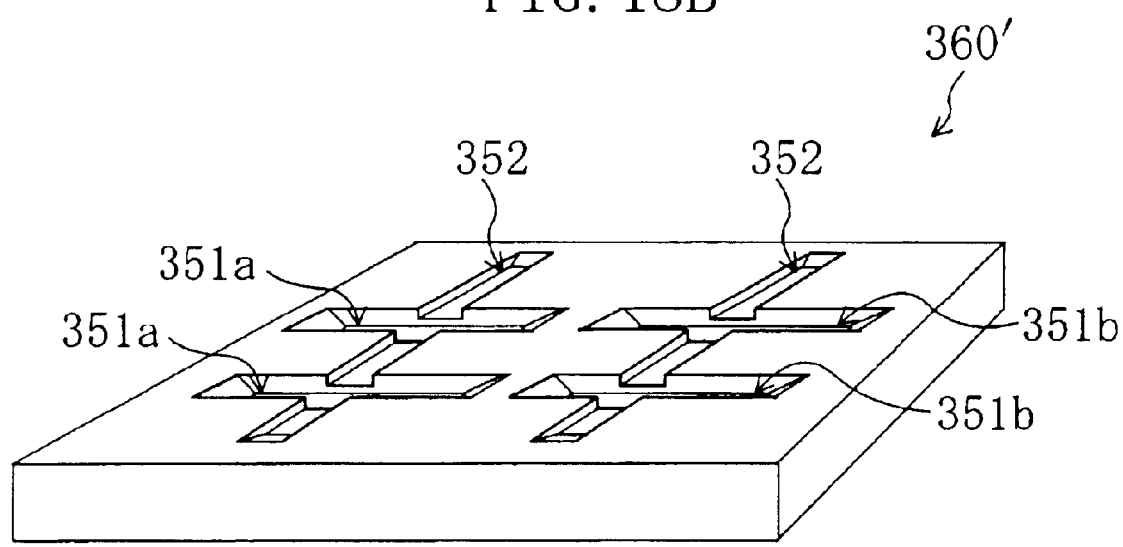
FIG. 18B is a perspective view of a substrate used in the wiring structure in FIG. 18A.
Figure 18C:
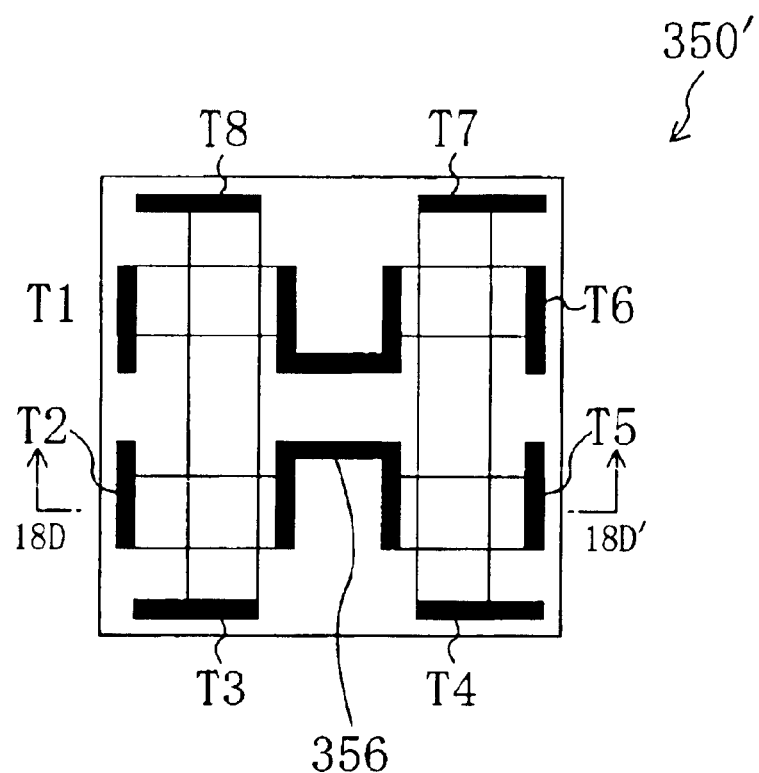
FIG. 18C is a top view of the wiring structure in FIG. 18A (with terminal electrodes)
Figure 18D:
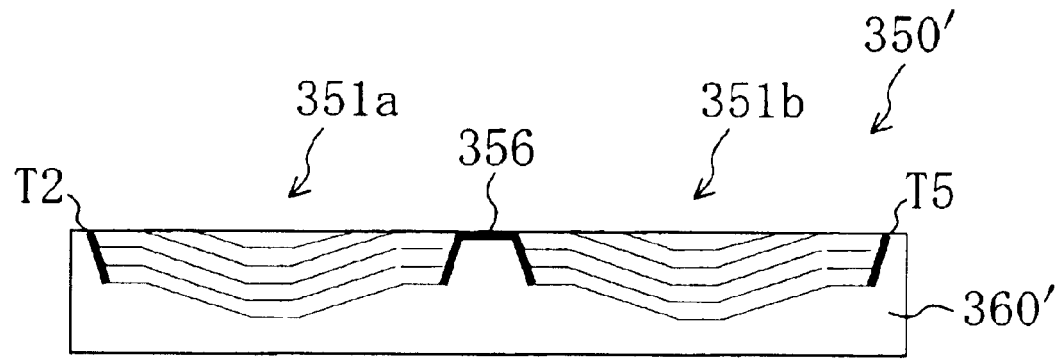
FIG. 18D is a cross-sectional view taken along line 18D–18D' in FIG. 18C.

A second method will now be described with reference to FIGS. 18A, 18B, 18C, 18D. FIG. 18A is a top view of a wiring structure 350' according to the second method (the terminal electrodes are not shown in the figure). FIG. 18B is a perspective view of a substrate 360' used in the wiring structure 350'. FIG. 18C is a top view of the wiring structure 350' (with the terminal electrodes). FIG. 18D is a cross-sectional view taken along line 18D–18D' in FIG. 18C.

As shown in FIGS. 18A, 18B, the wiring structure 350' has two pairs of grooves 351a, 351b. The grooves 351a, 351b of each pair are separated from each other at the position corresponding to the point X in FIG. 15. In other words, each pair corresponds to the groove 351 in FIG. 16. Connection electrodes 356 for connecting the wirings respectively formed at the lower level of the grooves 351a, 351b to each other are formed as shown in FIGS. 18C and 18D. As shown in FIG. 18D, the bottoms of the grooves 351a, 351b are tapered so that only the smectic layer (wiring) at the lower level connected to a terminal electrode T2, T5 contacts the connection electrode 356.

Figure 19:
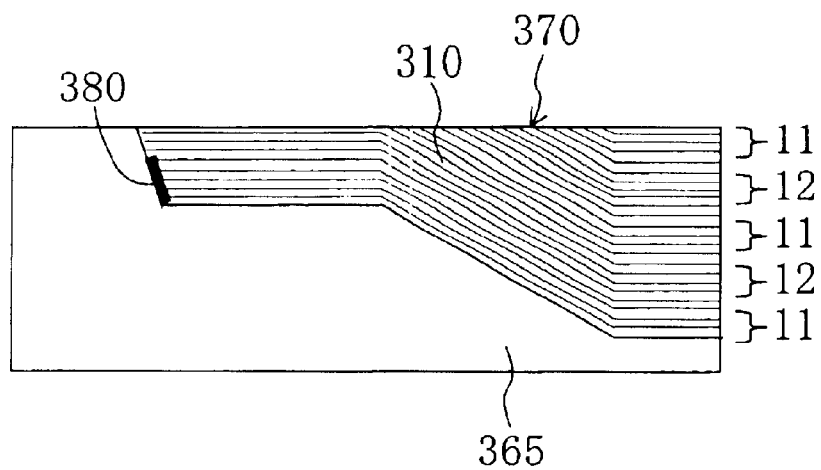
FIG. 19 illustrates the structure of a terminal electrode portion in the wiring structure having three wiring layers.

In the above example, two wiring layers are formed in the lamination 310 in each groove. However, three or more wiring layers can be formed similarly. As shown in FIG. 19, even when three wiring layers 11 are formed in the lamination 310 in a groove 370 of a substrate 365, a wiring layer 11 to be connected to a terminal electrode 380 can be defined by the level (depth) of the terminal electrode 380.

Figure 20A:
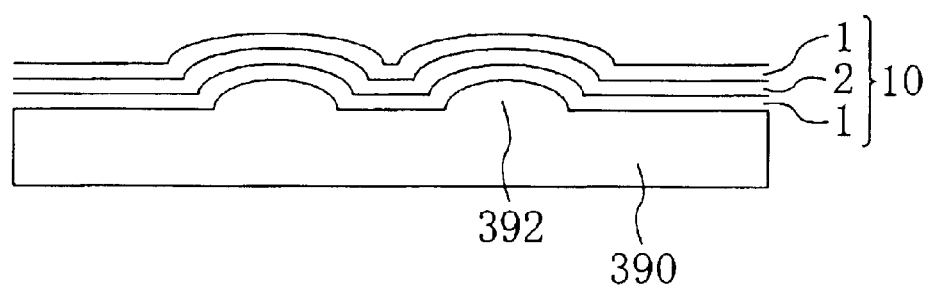
FIGS. 20A and 20B illustrate another manufacturing method of the wiring structure.
Figure 20B:
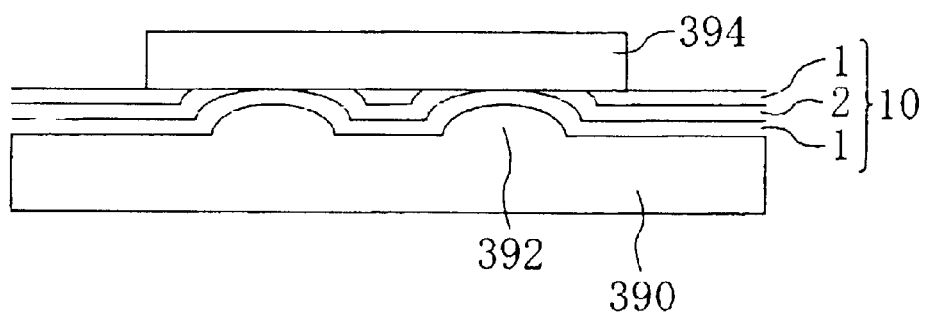

In the above example, the contour of the wiring layers is defined by forming a lamination in the grooves. As shown in FIGS. 20A, 20B, however, a substrate 390 having projections 392 at its surface may be used.

As shown in FIG. 20A, a substrate 390 having projections 392 at its surface is first prepared. For example, such a substrate 390 can be produced by embossing a plastic substrate. Electrically conductive layers 1 and at least one insulating layer 2 are alternately laminated on the surface of the substrate 390. For example, this is conducted by using a sputtering method.

As shown in FIG. 20B, the surface of the lamination 10 thus produced is then polished with, e.g., a grinding stone 394 to remove an unnecessary conductive layer 1. The contour of the electrically conductive layer (wiring layer) is thus defined. In other words, a wiring is formed in the region between the projections 392. Note that, for simplicity, only two electrically conductive layers 1 and one insulating layer 2 are shown in the figure. As has been described above, however, it is also possible to form a wiring layer including a plurality of electrically conductive layers 1 and to form an interlayer insulating layer including a plurality of insulating layers 2.

(Third Embodiment)

The wiring structure of the present invention is described in the first and second embodiments. However, it is also possible to form a waveguide structure (optical circuit structure).

The electrically conductive layers and the insulating layers in the wiring structure are respectively replaced with core layers and cladding layers in order to produce an alternate lamination of the core layers and the cladding layers. The waveguide structure thus produced is a lamination of a plurality of waveguide layers each formed by a pair of cladding layers and a core layer interposed therebetween.

Figure 21:
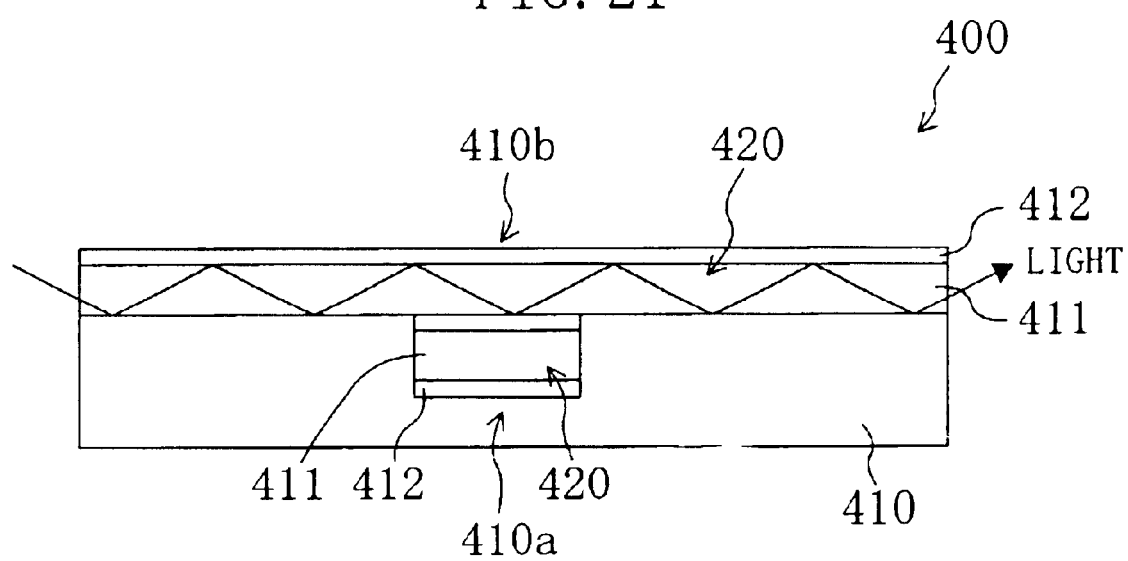
FIG. 21 schematically shows a waveguide structure according to a third embodiment of the present invention.

For example, like a waveguide structure 400 of FIG. 21, a plurality of waveguide layers 420 can be formed in a substrate 410 having two crossing grooves 410a, 410b of different depths. For example, the alternate laminated structure can be formed by a sputtering method using $SiO_2$ (n=1.46) as cladding layers 412 and 7059 glass (n=1.54) as core layers 411. For simplicity, only one waveguide layer 420 is shown to be formed in each groove 410a, 410b. However, it is preferable to form a lamination of a plurality of waveguide layers 420 in each groove 410a, 410b. The waveguide structure having a plurality of waveguide layers 420 laminated in the same direction is advantageous in that light having approximately uniform intensity can be obtained from a plurality of positions in the same direction. Such an advantage is obtained by providing an input/output (I/O section) (light extracting section) in each of the plurality of waveguide layers 420. On the other hand, when only one waveguide layer 420 is formed in each groove, providing an I/O section (light extracting section) at each of a plurality of positions in the same direction would cause large light extraction losses. This may possibly hinder light having approximately uniform intensity from being obtained.

The above waveguide structure can be used as an optical addressing circuit board for a liquid crystal display device and an optical circuit for optical computing.

As has been described above, the present invention provides a circuit structure (wiring structure and waveguide structure) that is manufactured by a simpler method than that in the conventional example, and a method for manufacturing such a circuit structure.

The circuit structure of the present invention is manufactured by a simpler method than that in the conventional example. This enables both reduction in manufacturing costs of electronic equipment and optical equipment having a complex circuit structure and reduction in energy required for manufacturing.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A circuit structure, comprising:
    a plurality of conductive paths each capable of transmitting light or electricity therethrough;
    a plurality of conductive path layers each having at least one of the plurality of conductive paths;
    at least one interlayer isolating layer formed between the plurality of conductive path layers to insulate the plurality of conductive path layers from each other; and
    a plurality of input/output (I/O) sections each connected to any one of the plurality of conductive paths, wherein
    each of the plurality of conductive path layers has a first laminated structure that includes a plurality of first conductive layers and at least one first isolating layer formed between the plurality of first conductive layers, and
    the at least one interlayer isolating layer has a second laminated structure that includes a plurality of second isolating layers and at least one second conductive layer formed between the plurality of second isolating layers.

2. The circuit structure according to claim 1, wherein the circuit structure functions as a waveguide structure in which
    the plurality of conductive paths are a plurality of waveguides, the plurality of conductive path layers are a plurality of waveguide layers, the plurality of first conductive layers are a plurality of first core layers, and the at least one first isolating layer is at least one first cladding layer, and the at least one interlayer isolating layer is at least one isolating layer for isolating the waveguide layers from each other, the plurality of second isolating layers are a plurality of second cladding layers, and the plurality of second conductive layers are a plurality of second waveguide layers.

3. The circuit structure according to claim 1, wherein the circuit structure functions as a wiring structure in which the plurality of conductive paths are a plurality of wirings, the plurality of conductive path layers are a plurality of wiring layers, the plurality of first conductive layers are a plurality of first electrically conductive layers, and the at least one first isolating layer is at least one first insulating layer, the at least one interlayer isolating layer is at least one interlayer insulating layer, the plurality of second isolating layers are a plurality of second insulating layers, and the plurality of second conductive layers are a plurality of second electrically conductive layers, and the plurality of I/O sections are a plurality of input/output (I/O) electrodes.

4. The circuit structure according to claim 3, wherein each of the plurality of I/O electrodes contacts the plurality of first electrically conductive layers of a corresponding first laminated structure at a surface crossing surfaces of the plurality of first electrically conductive layers.

5. The circuit structure according to claim 3, wherein the plurality of first electrically conductive layers included in the first laminated structure and the at least one second electrically conductive layer included in the second laminated structure are formed from substantially the same material, and the at least one first insulating layer included in the first laminated structure and the plurality of second insulating layers included in the second laminated structure are fanned from substantially the same material.

6. The circuit structure according to claim 3, further comprising:

a substrate having a plurality of grooves, wherein the plurality of wiring layers and the at least one interlayer insulating layer are formed in the plurality of grooves.

7. The circuit structure according to claim 3, wherein the first laminated structure and the second laminated structure are formed from a bilayer membrane of amphiphilic molecules.

8. The circuit structure according to claim 3, wherein the first laminated structure and the second laminated structure are formed from a material exhibiting a smectic phase.

9. The circuit structure according to claim 8, wherein the smectic phase is a smectic E phase.

10. The circuit structure according to claim 8, wherein the first laminated structure and the second laminated structure include a hardened smectic liquid crystal material.

11. The circuit structure according to claim 1, further comprising:

a substrate having at least one groove, wherein the first laminated structure is formed in the at least one groove.

12. A wiring structure, comprising:

a plurality of wirings;

a plurality of wiring layers each having at least one of the plurality of wirings;

at least an interlayer insulating layer formed between the plurality of wiring layers to insulate the plurality of wiring layers from each other; and a plurality of input/output (I/O) electrodes each connected to any one of the plurality of wirings, wherein each of the plurality of wiring layers is not substantially patterned.

* * * * *